United States Patent
Lee et al.

(10) Patent No.: US 10,211,264 B2
(45) Date of Patent: Feb. 19, 2019

(54) ORGANIC LIGHT EMITTING DISPLAY DEVICE HAVING A COLOR FILTER ON THIN FILM TRANSISTOR STRUCTURE AND METHOD OF MANUFACTURING THE SAME

(71) Applicant: LG DISPLAY CO., LTD., Seoul (KR)

(72) Inventors: YoungHak Lee, Gyeonggi-do (KR); ByungGeun Lee, Gyeonggi-do (KR); SuZy Ahn, Jeollanam-do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/945,907

(22) Filed: Nov. 19, 2015

(65) Prior Publication Data

US 2016/0163769 A1    Jun. 9, 2016

(30) Foreign Application Priority Data

Dec. 5, 2014 (KR) .................. 10-2014-0174400

(51) Int. Cl.
*H01L 27/32* (2006.01)
*H01L 51/52* (2006.01)
(Continued)

(52) U.S. Cl.
CPC ........ *H01L 27/322* (2013.01); *H01L 27/3246* (2013.01); *H01L 27/3248* (2013.01); *H01L 27/3262* (2013.01); *H01L 27/3272* (2013.01); *H01L 51/5209* (2013.01); *H01L 51/5253* (2013.01); *H01L 51/56* (2013.01);
(Continued)

(58) Field of Classification Search
CPC ............... H01L 27/322; H01L 27/3246; H01L 27/3248; H01L 27/3262; H01L 27/3272; H01L 27/1225; H01L 27/1248; H01L 27/1259; H01L 27/3258; H01L 51/5209;
(Continued)

(56) References Cited

U.S. PATENT DOCUMENTS 5,994,721 A * 11/1999 Zhong ............... G02F 1/136213
                                                    257/440
6,281,955 B1 * 8/2001 Midorikawa ..... G02F 1/133514
                                                    349/106
(Continued)

FOREIGN PATENT DOCUMENTS

CN          1577016 A    2/2005
CN        102593145 A    7/2012
(Continued)

OTHER PUBLICATIONS

Extended European Search Report dated Apr. 22, 2016, for corresponding European Patent Application No. 15181347.4.
(Continued)

*Primary Examiner* — Victoria K Hall
(74) *Attorney, Agent, or Firm* — Morgan, Lewis & Bockius LLP

(57) ABSTRACT

In an organic light emitting display device and a method of manufacturing the same, the organic light emitting display device has a color filter on thin film transistor (COT) structure, in which data wirings are formed after formation of a pixel electrode, thereby integrating a protective layer and a barrier layer. Thus, a manufacturing process may be simplified to increase productivity.

12 Claims, 12 Drawing Sheets

(51) Int. Cl.
  *H01L 51/56* (2006.01)
  *H01L 27/12* (2006.01)
(52) U.S. Cl.
  CPC ...... *H01L 27/1225* (2013.01); *H01L 27/1248* (2013.01); *H01L 27/1259* (2013.01); *H01L 27/3258* (2013.01); *H01L 2251/303* (2013.01)
(58) Field of Classification Search
  CPC ............... H01L 51/5253; H01L 51/56; H01L 2251/303; H01L 51/5237
  USPC ........................................................ 257/40
  See application file for complete search history.

(56) References Cited

U.S. PATENT DOCUMENTS

| | | | | |
|---|---|---|---|---|
| 6,365,916 | B1* | 4/2002 | Zhong | G02F 1/136213 257/59 |
| 6,407,782 | B1* | 6/2002 | Kim | G02F 1/133516 349/106 |
| 6,689,492 | B1* | 2/2004 | Yamazaki | H01L 27/1214 257/102 |
| 7,041,522 | B2* | 5/2006 | Tanaka | G02F 1/136209 438/149 |
| 7,193,668 | B2* | 3/2007 | Kim | G02F 1/133514 257/59 |
| 7,259,807 | B2* | 8/2007 | Kim | G02F 1/1333 257/797 |
| 7,394,510 | B2* | 7/2008 | Oh | G02F 1/134336 349/106 |
| 7,612,373 | B2* | 11/2009 | Park | G02F 1/13458 257/59 |
| 7,821,065 | B2* | 10/2010 | Murakami | G02F 1/13454 257/347 |
| 8,102,489 | B2* | 1/2012 | Kim | G02F 1/136204 349/106 |
| 9,040,995 | B2* | 5/2015 | Kimura | H01L 27/1225 257/59 |
| 9,632,362 | B2* | 4/2017 | Chiu | G02F 1/133784 |
| 2001/0006408 | A1* | 7/2001 | Matsuyama | G02F 1/1393 349/143 |
| 2002/0050795 | A1* | 5/2002 | Imura | H01L 27/3272 315/169.3 |
| 2003/0173895 | A1* | 9/2003 | Kato | H01L 27/322 313/504 |
| 2004/0065902 | A1* | 4/2004 | Yamazaki | H01L 27/3244 257/200 |
| 2004/0207321 | A1* | 10/2004 | Nishikawa | H01L 27/322 313/506 |
| 2004/0257489 | A1* | 12/2004 | Gotoh | G02F 1/136209 349/44 |
| 2004/0263722 | A1* | 12/2004 | Oh | G02F 1/134336 349/106 |
| 2004/0263754 | A1* | 12/2004 | Ahn | G02F 1/134363 349/141 |
| 2005/0140892 | A1* | 6/2005 | Kim | G02F 1/133707 349/139 |
| 2005/0270445 | A1* | 12/2005 | Lee | G02F 1/133514 349/108 |
| 2006/0054889 | A1* | 3/2006 | Kim | H01L 27/1255 257/59 |
| 2006/0289882 | A1* | 12/2006 | Nishimura | C09K 11/06 257/94 |
| 2007/0003743 | A1* | 1/2007 | Asano | B82Y 20/00 428/201 |
| 2007/0159565 | A1 | 7/2007 | Segawa et al. | |
| 2008/0211399 | A1* | 9/2008 | Ryuji | H01L 27/322 313/506 |
| 2012/0038267 | A1* | 2/2012 | Hanamura | H01L 27/322 313/504 |
| 2012/0161141 | A1* | 6/2012 | Jeon | H01L 27/322 257/59 |
| 2012/0175615 | A1* | 7/2012 | You | H01L 27/3258 257/57 |
| 2013/0020731 | A1 | 1/2013 | Kim et al. | |
| 2014/0014963 | A1 | 1/2014 | Yamazaki et al. | |
| 2014/0084259 | A1* | 3/2014 | Kim | H01L 51/5237 257/40 |
| 2014/0131696 | A1* | 5/2014 | Ono | H01L 29/7869 257/40 |
| 2014/0175393 | A1* | 6/2014 | Beak | H01L 27/3265 257/40 |
| 2014/0306198 | A1* | 10/2014 | Im | H01L 51/0013 257/40 |
| 2015/0187989 | A1* | 7/2015 | Sato | H01L 27/3244 257/98 |
| 2015/0380560 | A1* | 12/2015 | Ishikawa | H01L 29/7869 257/43 |
| 2016/0004107 | A1* | 1/2016 | Chiu | G02F 1/133784 349/43 |
| 2016/0043338 | A1* | 2/2016 | Seo | H01L 51/5215 257/89 |
| 2016/0049426 | A1* | 2/2016 | Lim | H01L 27/124 257/72 |
| 2016/0126258 | A1* | 5/2016 | Liu | H01L 27/124 257/72 |
| 2016/0139468 | A1* | 5/2016 | Kim | G02F 1/134309 349/43 |
| 2016/0211488 | A1* | 7/2016 | Nirengi | H01L 27/3248 |
| 2016/0372531 | A1* | 12/2016 | Shen | H01L 27/3246 |

FOREIGN PATENT DOCUMENTS

| | | |
|---|---|---|
| CN | 102890351 A | 1/2013 |
| CN | 103688364 A | 3/2014 |
| CN | 101000914 A | 7/2017 |
| EP | 0845812 A2 | 6/1998 |
| EP | 1058311 A2 | 12/2000 |

OTHER PUBLICATIONS

First Notification of Office Action dated Feb. 5, 2018 from the State Intellectual Property Office of China in counterpart Chinese Application No. 201510882551.X.

Second Notification of Office Action dated Oct. 19, 2018 from the State Intellectual Property Office of China in counterpart Chinese Application No. 201510882551.X.

* cited by examiner

ORGANIC LIGHT EMITTING DISPLAY DEVICE HAVING A COLOR FILTER ON THIN FILM TRANSISTOR STRUCTURE AND METHOD OF MANUFACTURING THE SAME

CROSS-REFERENCE TO RELATED APPLICATION

Pursuant to 35 U.S.C. § 119(a), this application claims the benefit of earlier filing date and right of priority to Korean Application No. 10-2014-0174400, filed on Dec. 5, 2014, the contents of which is incorporated by reference herein in its entirety.

BACKGROUND OF THE INVENTION

1. Field of the Invention

The present disclosure relates to an organic light emitting display device and a method of manufacturing the same, and particularly, to an organic light emitting display device having a color filter on thin film transistor (TFT) (COT) structure.

2. Discussion of the Related Art

Recently, as an interest in information displays has been on the rise and demand for using portable information mediums has grown, research into and commercialization of lighter, thinner flat panel displays (FPDs), replacing cathode ray tubes (CRTs), existing displays, has been actively conducted.

In the flat panel display field, liquid crystal displays (LCDs) have come to prominence. However, since LCDs are light receiving devices, rather than light emitting devices, and have shortcomings in terms of brightness, a contrast ratio, a viewing angle, and the like, novel display devices that may be able to overcome such shortcomings have been actively developed.

An organic light emitting display device, one of novel display devices, is self-luminous and thus it is excellent in terms of a viewing angle and a contrast ratio. Also, since the organic light emitting display device does not require a backlight, the organic light emitting display device may be lighter and thinner and is advantageous in terms of power consumption. In addition, the organic light emitting display device may be driven with a low DC voltage and have a fast response speed.

Hereinafter, a basic structure and operational characteristics of an organic light emitting display device will be described in detail with reference to the accompanying drawings.

FIG. 1 is a diagram illustrating a light emitting principle of a general organic light emitting diode.

In general, an organic light emitting display device includes an organic light emitting diode (OLED) as illustrated in FIG. 1.

The OLED includes an anode 18 as a pixel electrode, a cathode 28 as a common electrode 28, and organic layers 30a, 30b, 30c, 30d, and 30e formed between the anode 18 and the cathode 28.

The organic layers 30a, 30b, 30c, 30d, and 30e include a hole transport layer (HTL) 30b, an electron transport layer (ETL) 30d, and an emission layer (EML) 30c interposed between the hole transport layer 30b and the electron transport layer 30d.

Here, in order to enhance luminous efficiency, a hole injection layer (HIL) 30a is interposed between the anode 18 and the hole transport layer 30b and an electron injection layer (EIL) 30e is interposed between the cathode 28 and the electron transport layer 30d.

In the OLED configured in such a manner, when a positive (+) voltage and a negative (−) voltage are applied to the anode 18 and the cathode 28, respectively, holes passing through the hole transport layer 30b and electrons passing through the electron transport layer 30d are transferred to the emission layer 30c to form excitons, and when the excitons transition from an excited state to a ground state, namely, a stable state, light is generated.

In the organic light emitting display device, sub-pixels each including the OLED having the foregoing structure are arranged in a matrix form and selectively controlled with a data voltage and a scan voltage to display an image.

Here, the organic light emitting display device is divided into a passive matrix organic light emitting display device and an active matrix type organic light emitting display device using a thin film transistor (TFT) as a switching element. Here, in the active matrix type organic light emitting display device, a TFT, an active element, is selectively turned on to select a sub-pixel and light emission of the sub-pixel is maintained with a voltage maintained in a storage capacitor.

FIG. 2 is a cross-sectional view schematically illustrating a structure of a general organic light emitting display device.

Referring to FIG. 2, the general organic light emitting display device includes a substrate 1 in which a pixel part and a TFT pad part are defined, and an encapsulating layer 10 formed on the substrate 1 and covering the pixel part.

A polarizing plate (not shown) for presenting reflection of light incident from the outside may be attached to the encapsulating layer 10 through an adhesive layer.

Although not shown, pixels are disposed in a matrix form in the pixel part of the substrate 1, and driving elements such as a scan driver or a data driver for driving the pixels, and other components are positioned on outer side of the pixel part.

Pad electrodes for transmitting an electric signal to the scan driver and the data driver are positioned in the TFT pad part of the substrate 1.

The encapsulating layer 10 is formed above the OLEDs 30 and the driving circuits formed on the substrate 1 to seal and protect the OELDs 30 and the driving circuits from the outside.

Referring to the encapsulating layer 10, in detail, a first protective layer 13a, an organic layer 13b, and a second protective layer 13c are sequentially formed as an encapsulating unit on the substrate 1 with the cathode 28 formed thereon.

A protective film 15 formed of a plurality layers is positioned to face the entire surface of the substrate 1 with the second protective layer 13c formed thereon for encapsulation, and an adhesive 14 which is optically transparent and has adhesive properties is installed between the substrate 1 and the protective film 15.

In the general organic light emitting display device configured in such a manner, when an organic light emitting layer emitting white light is used, color filters are used to change white light to red, green, and blue light.

In manufacturing the organic light emitting display device having the COT structure (color filter on TFT), at least twelve masks are required to form a light blocking layer, an active layer, a gate line, a contact hole, a data line, a color filter, an overcoat layer, a protective layer, a pixel electrode, and a bank.

Thus, efforts to reduce the number of masks in terms of productivity have been made.

SUMMARY OF THE INVENTION

Accordingly, the present invention is directed to an organic light emitting display device and a method of manufacturing the same that substantially obviate one or more of the problems due to limitations and disadvantages of the related art.

An object of the present invention is to provide an organic light emitting display device and a method of manufacturing the same capable of simplifying a manufacturing process by reducing the number of masks.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of this specification, as embodied and broadly described herein, an organic light emitting display device comprises a transistor on a substrate and an including an active layer, a gate electrode, a source electrode, a drain electrode, an interlayer insulating layer between the gate electrode and the source and drain electrodes, a color filter on the interlayer insulating layer, and a first electrode on the color filter. The first electrode at least partially laterally overlaps the color filter and extends toward the transistor so as to be electrically connected to the drain electrode, thereby forming an extended portion of the first electrode. The organic light emitting display device further includes a barrier layer surrounding the vicinity of edges of the first electrode to define a light emitting region, and an organic light emitting layer and a second electrode on the barrier layer. At least a portion of the extended portion of the first electrode is positioned between the drain electrode and the interlayer insulating layer.

The barrier layer may include or be formed by a so-called bank or by a protective layer.

The organic light emitting layer may include white light emitting material.

The active layer may include oxide-based composite semiconductor material, e.g. amorphous zinc oxide-based composite semiconductor material.

The organic light emitting display device may further include a light blocking layer disposed over the substrate and below the active layer of the transistor.

The first electrode may be positioned directly on the color filter.

The drain electrode may be connected to a side surface of the first electrode and/or to an upper surface of the first electrode.

The barrier layer may be formed of an organic insulating material.

The barrier layer may be formed of an inorganic insulating material and may have a non-planar upper surface.

The barrier layer may be formed of a photosensitizer including black pigment.

The organic light emitting display device may further include an overcoat layer covering the color filter. The first electrode may be formed on the overcoat layer to cover the overcoat layer and extend to the transistor from one side thereof so as to be formed on the interlayer insulating layer.

In another aspect, a method of manufacturing an organic light emitting display device comprises forming an active layer on a substrate, forming a gate electrode on the active layer with a gate insulating layer interposed therebetween, forming an interlayer insulating layer on the gate electrode, forming a color filter on the interlayer insulating layer, forming a first electrode on the color filter, forming a source electrode and a drain electrode on the first electrode, forming a barrier layer to surround the vicinity of the edges of the first electrode, and forming an organic light emitting layer and a second electrode on the barrier layer. The first electrode at least partially laterally overlaps the color filter and extends toward a transistor so as to be positioned between the drain electrode and the interlayer insulating layer and electrically connected to the drain electrode.

The method may further include forming an overcoat layer covering the color filter. The first electrode may be formed on the overcoat layer to cover the overcoat layer and may extend to the transistor from one side thereof so as to be formed on the interlayer insulating layer.

The drain electrode may be connected to a side surface of the first electrode and/or to an upper surface of the first electrode.

The method may further include forming a light blocking layer disposed over the substrate and below the active layer of the transistor.

The first electrode may be formed directly on the color filter.

As described above, according to the organic light emitting display device having the COT structure and the method of manufacturing the same of an embodiment of the present disclosure, since the data line is formed after the formation of the pixel electrode, the protective layer and the bank are incorporated as a single component. Thus, the number of masks is reduced, reducing manufacturing process and cost and enhancing productivity.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments and together with the description serve to explain the principles of the invention. In the drawings.

DETAILED DESCRIPTION OF THE ILLUSTRATED EMBODIMENTS

Figure 1:
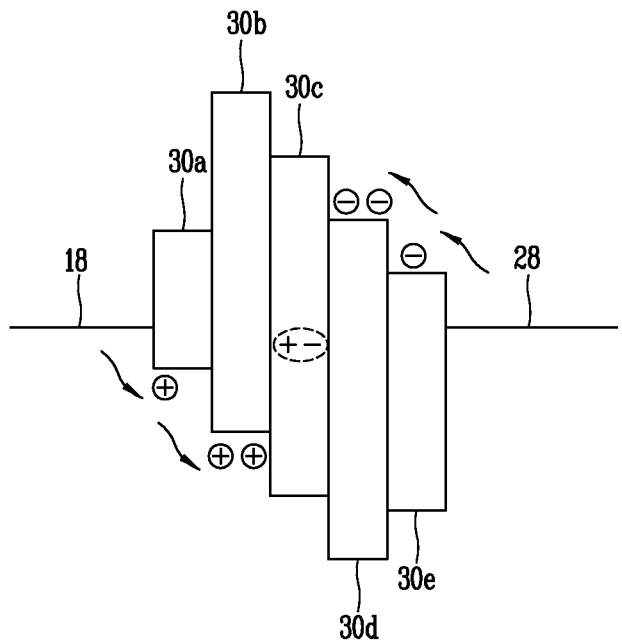
FIG. 1 is a diagram illustrating a principle of light emission of a general organic light emitting diode (OLED).
Figure 2:
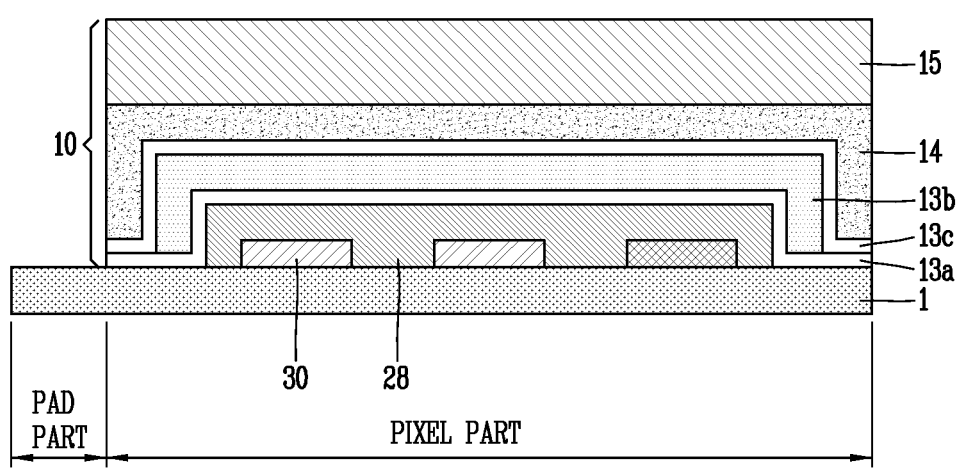
FIG. 2 is a cross-sectional view illustrating a structure of the general organic light emitting display device.

Hereinafter, an organic light emitting display device and a method of manufacturing the same according to embodiments will be described in detail with reference to the accompanying drawings such that they can be easily practiced by those skilled in the art to which the present disclosure pertains.

The advantages and features of the present disclosure and methods for achieving these will be clarified in detail through embodiments described hereinafter in conjunction with the accompanying drawings. However, embodiments of the present disclosure may, however, be implemented in many different forms and should not be construed as being limited to the embodiments set forth herein. Rather, these embodiments are provided so that this disclosure will be thorough and complete, and will fully convey the scope of the invention to those skilled in the art and are defined by the claim coverage of the present disclosure. Throughout the specification, the same reference numerals will be used to designate the same or like components. In the drawings, the sizes or shapes of elements may be exaggeratedly illustrated for clarity and convenience of description.

It will be understood that when an element or layer is referred to as being "on" or "connected to" another element or layer, it can be directly on or directly connected to the other element or layer, or intervening elements or layers may be present.

Relative terms, such as "lower" or "bottom" and "upper" or "top," may be used herein to describe the relationship of one or more elements to other elements as illustrated in the Figures. It will be understood that relative terms are intended to encompass different orientations of the device in addition to the orientation depicted in the Figures. For example, if a device in the Figures is turned over, elements described as being on the "lower" side of other elements would then be oriented on "upper" sides of the other elements. The exemplary term "lower," can therefore, encompasses both an orientation of "lower" and "upper," depending of the particular orientation of the figure. Similarly, if the device in one of the figures is turned over, elements described as "below" or "beneath" other elements would then be oriented "above" the other elements. The terms "below" or "beneath" can therefore encompass both an orientation of above and below.

The terms used herein are for the purpose of describing particular embodiments only and are not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Figure 3:
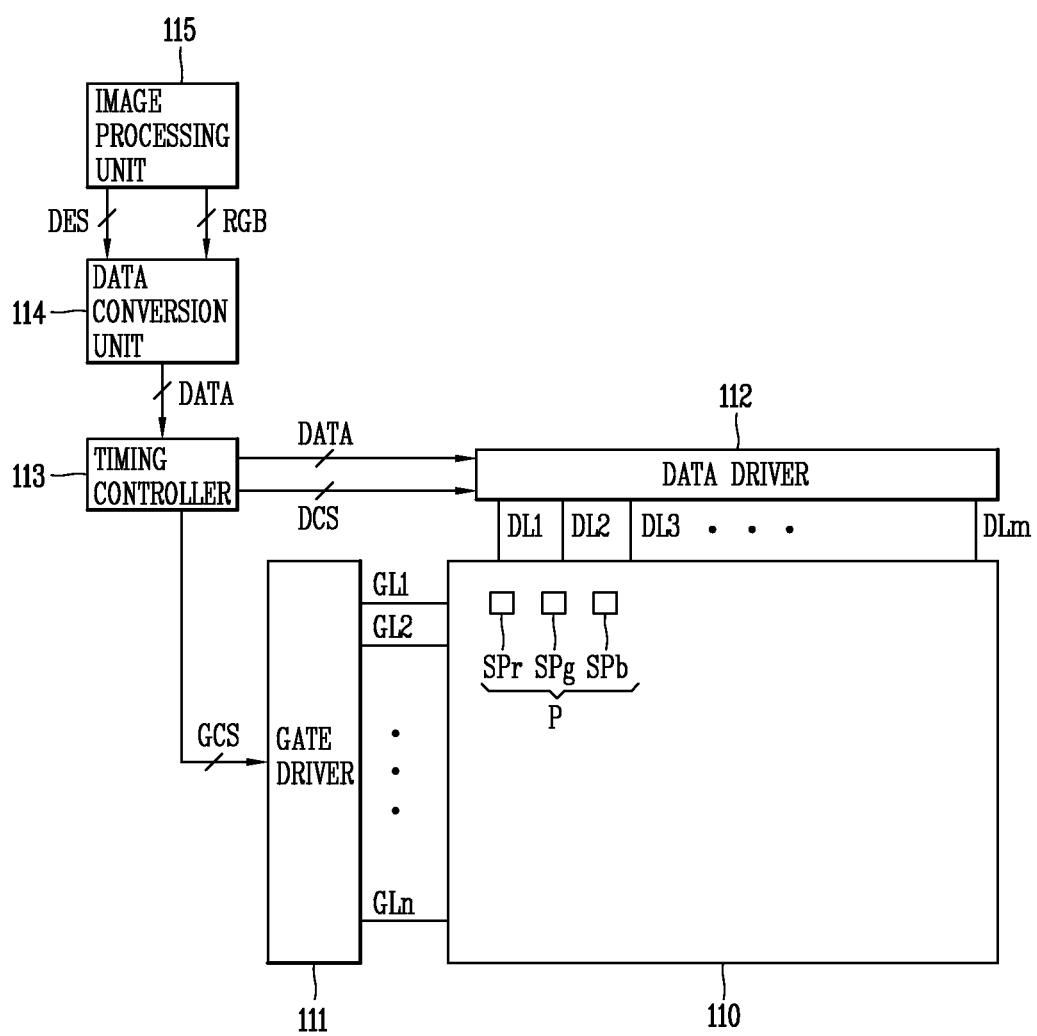
FIG. 3 is a block diagram schematically illustrating an organic light emitting display device according to an example embodiment of the present invention.

FIG. 3 is a block diagram schematically illustrating an organic light emitting display device according to an example embodiment of the present invention.

Referring to FIG. 3, the organic light emitting display device may include a image processing unit 115, a data conversion unit 114, a timing controller 113, a data driver 112, a gate driver 111, and a display panel 110.

The image processing unit 115 performs various image processing such as setting a gamma voltage to realize maximum luminance according to an average image level using an RGB data signal (RGB), and subsequently output the RGB data signal (RGB). The image processing unit 115 outputs a driving signal including one or more of a vertical synchronization signal (Vsync), a horizontal synchronization signal (Hsync), a data enable signal (DES), and a clock signal CLK.

The timing controller 113 receives a driving signal including one or more of the (optionally converted) RGB data signal, the vertical synchronization signal (Vsync), the horizontal synchronization signal (Hsync), the data enable signal (DES), and the clock signal CLK from the image processing unit 115 or the data conversion unit 114. The timing controller 113 outputs a gate timing control signal GCS for controlling an operation timing of the gate driver 111 and a data timing control signal DCS for controlling an operation timing of the data driver 112 on the basis of the driving signal.

The timing controller 113 outputs a data signal DATA according to the gate timing control signal GCS and the data timing control signal DCS.

In response to the data timing control signal DCS supplied from the timing controller 113, the data driver 112 samples and latches the data signal DATA supplied from the timing controller 113, converts the signal into a gamma reference voltage, and outputs the converted gamma reference voltage. The data driver 112 outputs the data signal DATA through data lines DL1 to DLm. The data driver 112 is formed as an integrated circuit (IC).

In response to the gate timing control signal GCS supplied from the timing controller 113, the gate driver 111 outputs a gate signal, while shifting a level of a gate voltage. The gate driver 111 outputs the gate signal through gate lines GL1 to GLn. The gate driver 111 may be formed as an IC or may be formed in a gate-in-panel (GIP) manner in the display panel 110.

The display panel 110 may have a sub-pixel structure including a red sub-pixel SPr, a green sub-pxiel SPg, and a blue sub-pixel SPb. That is, a single pixel P includes RGB sub-pixels SPr, SPg, and SPb. However, the structure of the display panel 110 is not limited thereto and may include a white sub-pixel.

Figure 4:
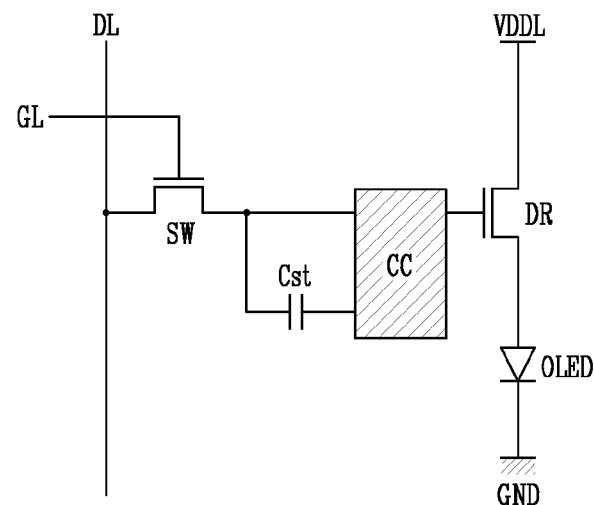
FIG. 4 is a view illustrating a configuration of a circuit regarding a sub-pixel of an organic light emitting display device.

FIG. 4 is a view illustrating a configuration of a circuit regarding a sub-pixel of an organic light emitting display device.

The sub-pixel illustrated in FIG. 4 has a 2$t$ (transistor) 1C (capacitor) structure including a switching transistor, a driving transistor, a capacitor, and an OLED, for example. However, the sub-pixel is not limited thereto and may be variously modified to have a structure of 3T1C, 4T2C, or 5T2C in case where a compensation circuit is added.

Referring to FIG. 4, in the organic light emitting display device, the sub-pixel region is defined by a gate line GL arranged in a first direction and a data line DL and a driving power line VDDL arranged to be spaced apart from one another in a second direction intersecting the first direction, e.g. perpendicular to the first direction.

The single sub-pixel may include a switching transistor SW, a driving transistor DR, a capacitor Cst, a compensation circuit CC, and an OLED.

The OLED operates to emit light according to a driving current formed by the driving transistor DR.

In response to a gate signal supplied through the gate line GL, the switching transistor SW performs a switching operation such that a data signal supplied through the data line DL is stored as a data voltage in the capacitor Cst.

The driving transistor DR operates to allow a driving current to flow between the driving power line VDDL and a ground line GND according to the data voltage stored in the capacitor Cst.

The compensation circuit CC compensates for a threshold voltage, or the like, of the driving transistor DR. The compensation circuit CC may include one or more transistors and one or more capacitors. The compensation circuit (CC) may be variously configured and a specific example and a description thereof will be omitted.

The organic light emitting display device having the foregoing sub-pixel structure may be implemented as a top emission type organic light emitting display device, a bottom emission type organic light emitting display device, or a dual-emission type organic light emitting display device.

Figure 5:
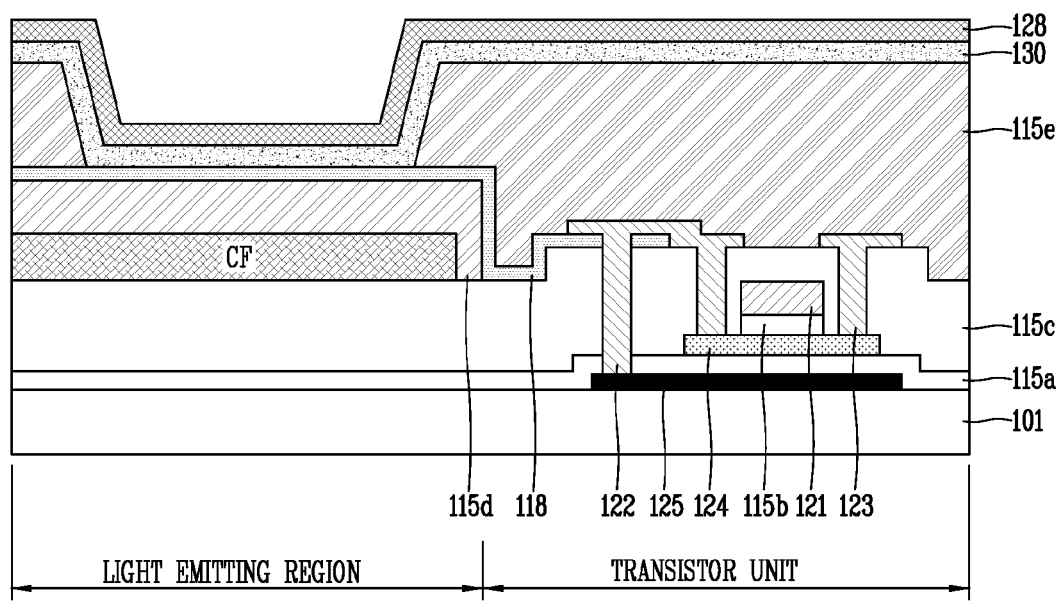
FIG. 5 is a cross-sectional view illustrating a structure of an organic light emitting display device according to a first example embodiment of the present invention.

FIG. 5 is a cross-sectional view illustrating a structure of an organic light emitting display device according to a first example embodiment of the present invention.

The organic light emitting display device illustrated in FIG. 5 is a bottom emission type organic light emitting display device in which light is emitted in a direction toward a substrate on which pixels are arranged, for example. However, the present disclosure is not limited thereto and may also be applied to a top emission type organic light emitting display device in which light is emitted in a direction opposite to the substrate on which pixels are arranged, or to a dual-emission type organic light emitting display device.

FIG. 5 illustrates an example of a single sub-pixel of the organic light emitting display device using a TFT having a coplanar structure. However, the present disclosure is not limited to the TFT having the coplanar structure.

The organic light emitting display device illustrated in FIG. 5 includes, for example, a white OLED emitting white light using at least two organic light emitting layers, and in this case, since the organic light emitting layer emits white light, a color filter for changing white light into red, green, or blue light is used.

Here, each RGB sub-pixel may be implemented by using a white OLED and an RGB color filter.

The RGB sub-pixel includes a transistor, an RGB color filter, and a white OLED. Here, when a white sub-pixel is provided, the white sub-pixel may include a transistor and a white OLED.

That is, the RGB sub-pixel includes an RGB color filter for converting white light output from the white OLED into red, green, or blue light. Meanwhile, the white sub-pixel may output white light output from the white OLED as is, and thus, it does not include a color filter.

Unlike a scheme of depositing red, green, and blue light emitting materials in each sub-pixel independently, in the scheme of using RGB sub-pixels, a white light emitting material is deposited in every sub-pixel. Thus, this scheme allows for realizing a large size even without using a fine metal mask (FMM), lengthening a lifespan, and reducing power consumption.

Referring to FIG. 5, a single sub-pixel may include a transistor, a white OLED, and a color filter CF formed on a substrate 101.

First, a driving TFT, as a transistor, includes an active layer 124, a gate electrode 121, a source electrode 123, and a drain electrode 122.

The active layer 124 is formed of an insulating material such as transparent plastic or a polymer film on the substrate 101.

The active layer 124 may be formed of an oxide semiconductor.

However, the present disclosure is not limited thereto and the active layer may be formed of an amorphous silicon film, a polycrystalline silicon film formed by crystallizing amorphous silicon, or an organic semiconductor.

When the active layer 124 is formed using an amorphous zinc oxide (ZnO)-based semiconductor, high mobility and constant current test conditions are met and uniform characteristics are secure, having an advantage of being applicable to a large display.

The zinc oxide is a material capable of implementing three properties of conductivity, semiconductive characteristics, and resistivity according to content of oxygen, and an oxide TFT including the active layer 124 formed of an amorphous zinc oxide-based semiconductor material may be applied to a large display including a liquid crystal display (LCD) and an organic light emitting display device.

Also, recently, interest and activities have been concentrated on transparent electronic circuits, and the oxide TFT including the active layer 124 formed of the amorphous zinc oxide-based semiconductor has high mobility and is manufactured at low temperatures, and thus, the oxide TFT may be used in transparent electronic circuits.

For example, in this embodiment, the active layer 124 may be formed of a z-IGZO semiconductor obtained by containing a heavy metal such as indium (In) and gallium (Ga) in a zinc oxide.

Since the a-IGZO semiconductor allows visible light to pass therethrough, it is transparent, and also, an oxide TFT formed of the a-IGZO semiconductor has mobility ranging from 1 to 100 $cm^2/Vs$, exhibiting mobility characteristics higher than that of an amorphous silicon TFT.

Also, the oxide TFT formed of the a-IGZO semiconductor has uniform characteristics similar to that of the amorphous silicon TFT, and thus, the oxide TFT may have a simple component structure, like the amorphous silicon TFT, and may be applied to a large display.

Here, a buffer layer 115a may be formed between the substrate 101 and the active layer 124. The buffer layer 115a may be formed to protect a transistor formed in a follow-up process from impurities such as alkali ions discharged from the substrate 101.

A light blocking layer 125 formed of an opaque material such as molybdenum (Mo) may be formed between the buffer layer 115a below the active layer 124 and the substrate 101.

A gate line (not shown) including a gate line, e.g., a gate electrode 121, and a first storage electrode (not shown) are formed on the active layer 124 with a gate insulating layer 115b interposed therebetween.

The gate insulating layer 115b may be formed as an inorganic insulating film such as a silicon nitride film (SiNx)

or a silicon oxide film (SiO$_2$), or formed as a highly dielectric oxide film such as a hafnium (Hf) oxide or an aluminum oxide.

The gate electrode 121, the gate line, and the first storage electrode may be formed as a single layer or multiple layers formed of a first metal material having low resistivity characteristics, for example, aluminum (Al), an Al alloy, tungsten (W), copper (Cu), nickel (Ni), chromium (Cr), molybdenum (Mo), titanium (Ti), platinum (Pt), tantalum (Ta), or an alloy thereof.

Also, the gate electrode 121, the gate line, and the first storage electrode may be formed of a transparent conductive material such as indium tin oxide (ITO) or indium zinc oxide (IZO).

An interlayer insulating layer 115c is formed on the gate electrode 121, the gate line, and the first storage electrode, and a color filter CF is formed thereon. The color filter CF is a color conversion material formed in a light emitting region and converts white light output from the OLED into red, green, and blue light.

An overcoat layer 115d is formed on the color filter CF to cover the color filter CF.

The overcoat layer 115d may be formed only in the light emitting region in which the color filter CF is formed. In this case, contamination due to pigment eluted from the color filter CF may be prevented.

The overcoat layer 115d may be formed of an organic material, or may also be formed of an inorganic material or a mixture of an organic material and an inorganic material.

A first electrode layer 118, a pixel electrode, is formed on the overcoat layer 115d to cover the overcoat layer 115d. Here, the first electrode 118 covers the overcoat layer 115d formed in the light emitting region, and extends from one side thereof to the transistor unit so as to be formed on the interlayer insulating layer 115c.

Data wirings, namely, a data line (not shown), a driving voltage line (not shown), source and drain electrodes 123 and 122, and a second storage electrode (not shown), are formed on the interlayer insulating layer 115c with the first electrode 118 formed thereon.

The interlayer insulating layer 115c may be formed as an inorganic insulating film such as a silicon nitride film (SiNx) or a silicon oxide film (SiO$_2$), or formed as a highly dielectric oxide film such as a hafnium (Hf) oxide or an aluminum oxide.

The source electrode 123 and the drain electrode 122 are formed to be spaced apart from one another by a predetermined distance and electrically connected to the active layer 124. In detail, first and second contact holes exposing the active layer 124 are formed in the interlayer insulating layer 115c, and the source and drain electrodes 123 and 122 are electrically connected to the active layer 124 through the first and second contact holes.

Here, another portion of the drain electrode 122 is formed on the first electrode 118 and connected to the first electrode 118. In this manner, in this embodiment, the first electrode 118 is positioned under the drain electrode 122, eliminating the necessity of a protective layer for insulating the data wirings and the first electrode 118. Thus, the number of masks may be reduced.

The other portion of the drain electrode 122 may be electrically connected to the light blocking layer 125. In detail, a third contact hole exposing the light blocking layer 125 may be formed in the buffer layer 115a, the interlayer insulating layer 115c and the first electrode 118, and the drain electrode 122 may be electrically connected to the light blocking layer 125 through the third contact hole. In this case, an electrical influence of the light blocking layer 125 on the active layer 124 due to the light blocking layer may be reduced or even minimized.

However, the present disclosure is not limited thereto, and the drain electrode 122 according to embodiments may not be connected to the light blocking layer 125.

Also, the drain electrode 122 may be connected to a side surface of the first electrode 118 where the third contact hole is formed, as well as to an upper surface of the first electrode 118.

In this manner, the source electrode 123 may be provided within the first contact hole and on the interlayer insulating layer 115c, and portions of the drain electrode 122 may be provided within the second and third contact holes and on the interlayer insulating layer 115c, and the other portion of the drain electrode 122 may be provided on the first electrode 118. Thus, contact resistance may be reduced.

Here, the second storage electrode may overlap a portion of the first storage electrode therebelow with the interlayer insulating layer 115c interposed therebetween to form a storage capacitor.

The data line, the driving voltage line, the source and drain electrodes 123 and 122, and the second storage electrode may be formed as a single layer or multiple layers formed of a second metal material having low resistivity characteristics, for example, aluminum (Al), an Al alloy, tungsten (W), copper (Cu), nickel (Ni), chromium (Cr), molybdenum (Mo), titanium (Ti), platinum (Pt), tantalum (Ta), or an alloy thereof.

Also, the data line, the driving voltage line, the source and drain electrodes 123 and 122, and the second storage electrode may be formed of a transparent conductive material such as indium tin oxide (ITO) or indium zinc oxide (IZO).

A bank 115e is formed on the substrate 101 with the data line, the driving voltage line, the source and drain electrodes 123 and 122, and the second storage electrode formed thereon.

In the first example embodiment, the bank 115e may serve as a protective layer. However, the present invention is not limited thereto and a protective layer may serve as a bank.

Here, the bank 115e surrounds the vicinity of edges of the first electrode 118 to define an opening, and is formed of an organic insulating material. The bank 115e may be formed directly on the source and drain electrodes 123 and 122 so as to be in contact with the source and drain electrodes 123 and 122.

When the bank 115e is formed of an organic insulating material, the bank 115e may serve as a planarization layer flattening an upper surface, as well as serving as a protective layer.

Three sub-pixels are separated by the bank 115e.

The bank 115e may be formed of a photosensitizer including black pigment, and in this case, the bank 115e may serve as a light blocking member.

An organic light emitting layer 130 and a second electrode 128, a common electrode, are sequentially formed on the substrate 101 with the bank 115e formed thereon.

The OLED may include the first electrode 118, the organic light emitting layer 130, and the second electrode 128.

The first electrode 118, supplying a current (or a voltage) to the organic light emitting layer 130, defines a light emitting region having a predetermined area.

Also, the first electrode 118 serves as an anode. Thus, the first electrode 118 may include a material having a work function relatively greater than that of the second electrode 128. For example, the first electrode 118 may include ITO or IZO, but the present disclosure is not limited thereto.

The organic light emitting layer 130 is formed between the first electrode 118 and the second electrode 128. The organic light emitting layer 130 emits light according to combination of holes supplied from the first electrode 118 and electrons supplied from the second electrode 128.

The organic light emitting layer 130 may have a multi-layer structure including a light emitting layer emitting layer and an auxiliary layer for enhancing luminous efficiency of the light emitting layer.

The organic light emitting layer 130 may be formed as a single layer across (extending over) the entire pixels. In this case, preferably, the organic light emitting layer 130 includes an organic light emitting material generating white light. In this case, color filters CF may be formed in each sub-pixel in order to express various colors.

In another example, the organic light emitting layer 130 may be formed to be divided in each sub-pixel. In particular, in this case, the organic light emitting layer 130 may include an organic light emitting material emitting any one of red, green, and blue light in each sub-pixel.

The second electrode 128 is formed on the organic light emitting layer 130 and provides electrons to the organic light emitting layer 130.

The second electrode 128 may be formed to cover the entirety of the substrate 101. That is, while the first electrode 118 is divided by sub-pixels, the second electrode 128 may be formed as a single layer across the entire pixels.

Hereinafter, a method of manufacturing the organic light emitting display device according to the first example embodiment as described above will be described in detail with reference to the accompanying drawings.

FIGS. 6A through 6J are cross-sectional views sequentially illustrating a method of manufacturing an organic light emitting display device according to the first example embodiment of the present invention illustrated in FIG. 5.

Figure 6A:
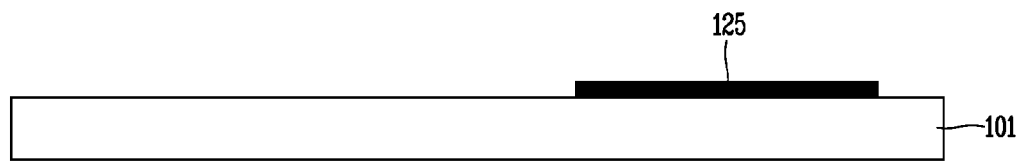
FIGS. 6A through 6J are cross-sectional views sequentially illustrating a method of manufacturing an organic light emitting display device according to the first example embodiment of the present invention illustrated in FIG. 5.

As illustrated in FIG. 6A, a light blocking layer 125 is formed on a substrate 101 formed of a transparent insulating material through a photolithography process (a first mask process).

Here, an amorphous zinc oxide-based composite semiconductor applied to an oxide TFT may be deposited at low temperatures, and thus, a substrate applicable to a low temperature process such as a plastic substrate or a soda lime glass may be used. Also, since the amorphous zinc oxide-based composite semiconductor exhibits amorphous characteristics, a substrate for a large display may be used.

A light blocking layer 125 may be formed of an opaque material such as molybdenum (Mo).

The light blocking layer 125 may be formed to be limited to a transistor unit.

Figure 6B:
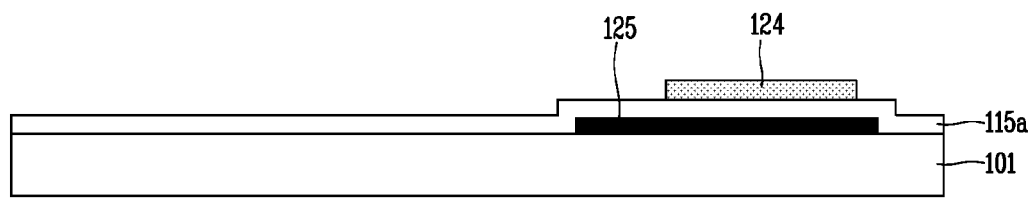

Thereafter, as illustrated in FIG. 6B, a buffer layer 115a is formed on the substrate 101 with the light blocking layer 125 formed thereon.

Here, the buffer layer 115a may be formed to protect a transistor from impurities such as alkali ions discharged from the substrate 101, and may be formed as a silicon oxide film.

Thereafter, a semiconductor thin film is formed on the substrate 101 with the buffer layer 115a formed thereon.

The semiconductor thin film may be formed of an oxide semiconductor.

However, the present disclosure is not limited thereto, and the semiconductor thin film may be formed of an amorphous silicon film, a polycrystalline silicon film formed by crystallizing amorphous silicon, or an organic semiconductor.

Thereafter, the semiconductor thin film is selectively removed through a photolithography process (a second mask process) to form an active layer 124 formed of the semiconductor thin film.

Figure 6C:
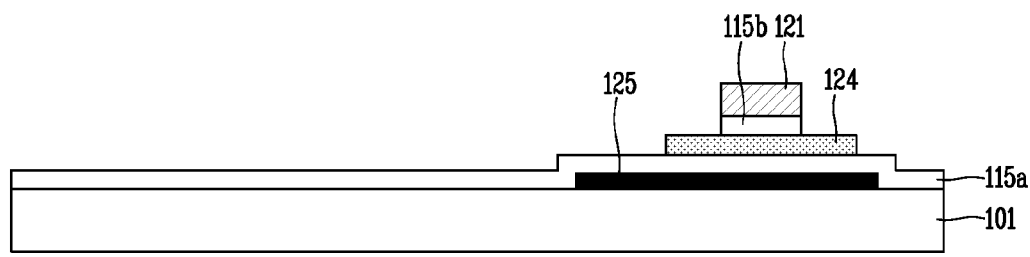

Thereafter, as illustrated in FIG. 6C, an insulating film and a first conductive film are formed on the substrate 101 with the active layer 124 formed thereon.

In order to form a gate insulating layer, the insulating film may be formed as an inorganic insulating film such as a silicon nitride film (SiNx) or a silicon oxide film ($SiO_2$), or formed as a highly dielectric oxide film such as a hafnium (Hf) oxide or an aluminum oxide.

In order to form gate wirings, the first conductive film may be formed as a single layer or multiple layers formed of aluminum (Al), an Al alloy, tungsten (W), copper (Cu), nickel (Ni), chromium (Cr), molybdenum (Mo), titanium (Ti), platinum (Pt), tantalum (Ta), or an alloy thereof. Also, the first conductive film may be formed of a transparent conductive material such as ITO or IZO.

Thereafter, the insulating film and the first conductive film are selectively removed through a photolithography process (a third mask process) to form a gate line including a gate electrode 121 and a first storage electrode formed of the first conductive film with the gate insulating layer 115b interposed therebetween.

However, the present disclosure is not limited thereto, and the active layer 124, the gate line including the gate electrode 121, and the first storage electrode may be formed through a single photolithography process.

Figure 6D:
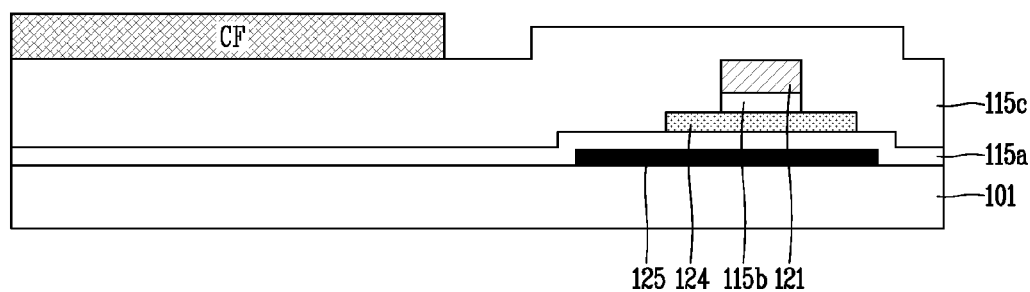

Thereafter, as illustrated in FIG. 6D, an interlayer insulating layer 115c is formed on the entire surface of the substrate 101 with the gate line including the gate electrode 121 and the first storage electrode formed thereon.

The interlayer insulating layer 115c may be formed as an inorganic insulating film such as of a silicon nitride film (SiNx) or a silicon oxide film ($SiO_2$), or formed as a highly dielectric oxide film such as a hafnium (Hf) oxide or an aluminum oxide.

Thereafter, a color filter CF is formed on the substrate 101 with the interlayer insulating layer 115c formed thereon by performing a photolithography process three times (fourth to sixth mask processes).

The color filter CF is a color conversion material formed in a light emitting region and converts white light output from an OLED to red, green, and blue light.

Figure 6E:
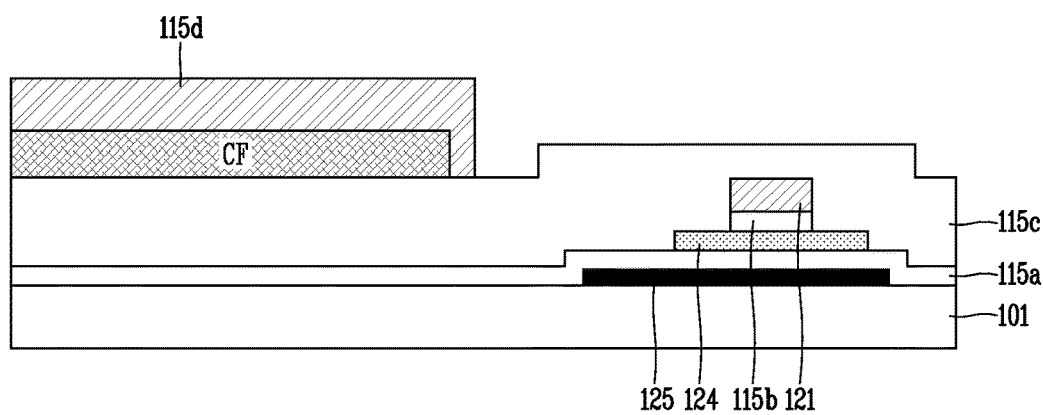

Thereafter, as illustrated in FIG. 6E, an overcoat layer 115d is formed to cover the color filter CF on the substrate 101 with the color filter CF formed thereon (a seventh mask process).

The overcoat layer 115d may be formed only in the light emitting region in which the color filter CF is formed.

The overcoat layer 115d may be formed of an organic material, or may be formed of an inorganic material or a mixture of an inorganic material and an organic material.

Figure 6F:
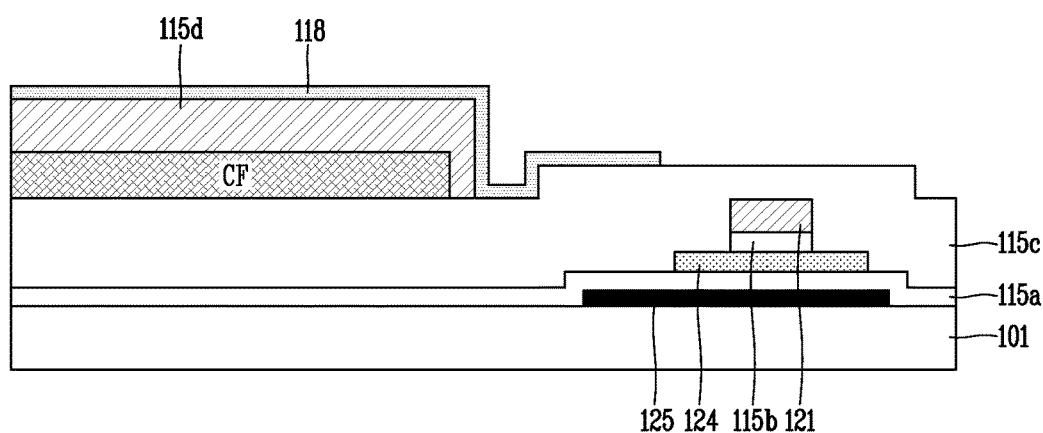

Thereafter, as illustrated in FIG. 6F, a second conductive film is formed on the entire surface of the substrate 101 with the overcoat layer 115d formed thereon.

Here, the second conductive film may be formed of a transparent conductive material such as ITO or IZO, but the present disclosure is not limited thereto.

The second conductive film may substantially have translucency and reflectivity. In this case, a very thin metal layer formed of silver (Ag), a silver (Ag) alloy or a magnesium (Mg) alloy may be used as the second conductive film.

Thereafter, the second conductive film is selectively removed through a photolithography process (an eighth mask process) to form a first electrode 118 formed of the second conductive film.

The first electrode 118 is formed on the overcoat layer 115d to cover the overcoat layer 115d. That is, the first electrode 118 may cover the overcoat layer 115d formed in the light emitting region and extend to the transistor unit from one side thereof so as to be formed on the interlayer insulating layer 115c.

Figure 6G:
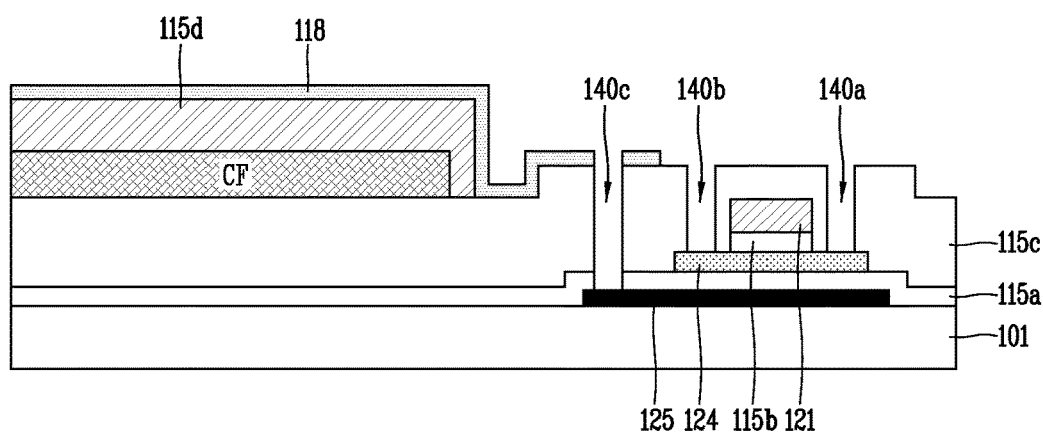

Thereafter, as illustrated in FIG. 6G, portions of the buffer layer 115a, the interlayer insulating layer 115c, and the first electrode 118 are selectively removed through a photolithography process (a ninth mask process) to form first and second contact holes 140a and 140b exposing portions of the active layer 124 and a third contact hole 140c exposing a portion of the light blocking layer 125.

However, the present disclosure is not limited thereto and the third contact hole 140c may not be formed.

Figure 6H:
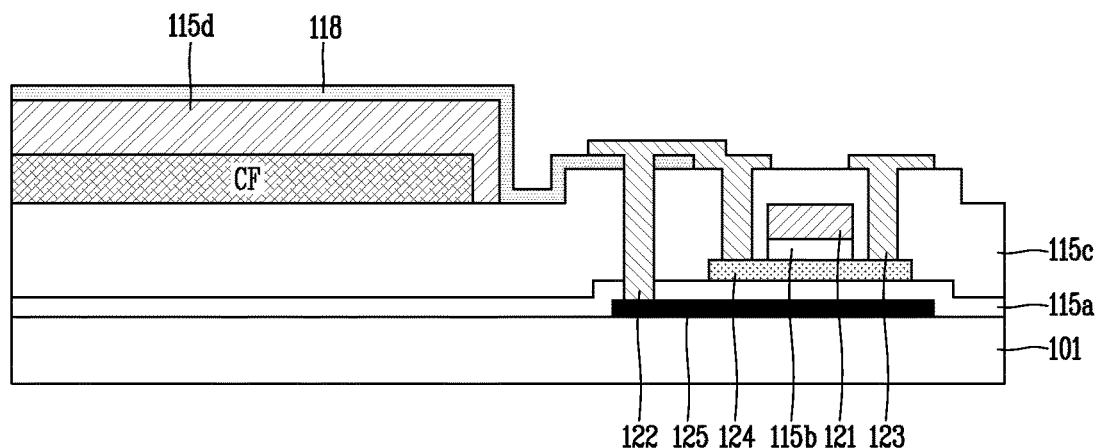

Thereafter, as illustrated in FIG. 6H, a third conductive film is formed on the entire surface of the substrate 101 with the first electrode 118 formed thereon.

In order to form data wirings, the third conductive film may be formed as a single layer or multiple layers formed of aluminum (Al), an Al alloy, tungsten (W), copper (Cu), nickel (Ni), chromium (Cr), molybdenum (Mo), titanium (Ti), platinum (Pt), tantalum (Ta), or an alloy thereof.

Also, the third conductive film may be formed of a transparent conductive material such as ITO or IZO.

Thereafter, the third conductive film is selectively removed through a photolithography process (a tenth mask process) to form a data line (not shown), a driving voltage line (not shown), source and drain electrodes 123 and 122, and a second storage electrode (not shown) on the interlayer insulating layer 115c with the first electrode 118 formed thereon.

The source electrode 123 and the drain electrode 122 are formed to be spaced apart from one another by a predetermined distance and electrically connected to the active layer 124. That is, the source and drain electrodes 123 and 122 are electrically connected to source and drain regions of the active layer 124 through the first and second contact holes.

Here, another portion of the drain electrode 122 is formed on the first electrode 118 so as to be connected to the first electrode 118. As described above, in this example embodiment, the first electrode 118 is positioned under the drain electrode 122, and thus, a protective layer for insulating the data wirings and the first electrode 118 is not required.

The other portion of the drain electrode 122 may be electrically connected to the light blocking layer 125. That is, the other portion of the drain electrode 122 may be electrically connected to the light blocking layer 125 through the third contact hole. In this case, an electrical influence of the light blocking layer 125 on the active layer 124 due to the light blocking layer may be reduced or even minimized.

However, the present disclosure is not limited thereto, and the drain electrode 122 according to embodiments may not be connected to the light blocking layer 125.

Also, the drain electrode 122 may be connected to a side surface of the first electrode 118 where the third contact hole is formed, as well as to an upper surface of the first electrode 118. Thus, contact resistance may be reduced.

The second storage electrode may overlap a portion of the first storage electrode therebelow with the interlayer insulating layer 115c interposed therebetween to form a storage capacitor.

Figure 6I:
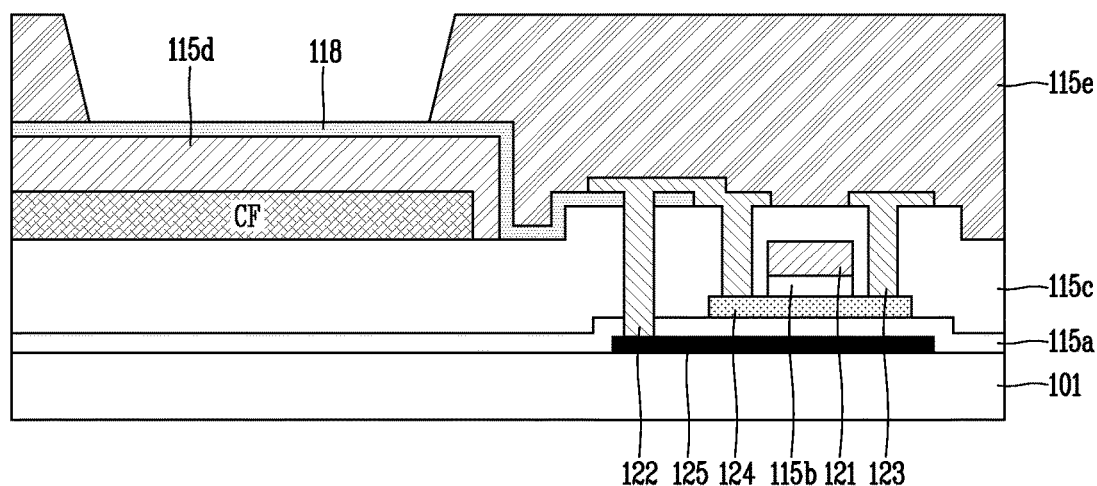

Thereafter, as illustrated in FIG. 6I, a bank 115e is formed on the substrate 101 with the data line, the driving voltage line, the source and drain electrodes 123 and 122, and the second storage electrode formed thereon (an eleventh mask process).

Here, the bank 115e surrounds the vicinity of edges of the first electrode 118 to define an opening, and is formed of an organic insulating material.

Three sub-pixels are separated by the bank 115e.

The bank 115e may be formed of a photosensitizer including black pigment, and in this case, the bank 115e may serve as a light blocking member.

As described above, in order to manufacture the organic light emitting display device according to the first example embodiment, a total of eleven masks is required to form the light blocking layer, the active layer, the gate wirings, the color filter, the overcoat layer, the pixel electrode, the contact holes, the data wirings, and the bank. Thus, the number of masks may be reduced, compared with the existing method, reducing the manufacturing process and cost and enhancing productivity.

Figure 6J:
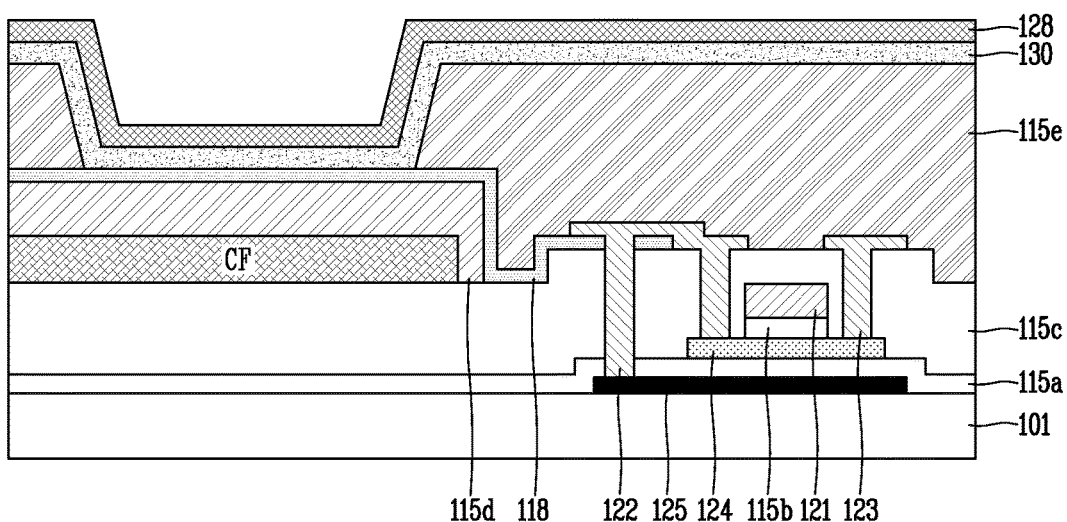

Thereafter, as illustrated in FIG. 6J, an organic light emitting layer 130 is formed on the substrate 101 with the bank 115e formed thereon.

Although not shown in detail, first, a hole injection layer, a hole transport layer, a light emitting layer, and an electron transport layer are sequentially formed on the substrate 101.

Here, any one of the hole injection layer and the hole transport layer may be omitted.

An electron injection layer may be formed on the electron transport layer in order to allow electrons to be smoothly injected.

The organic light emitting layer 130 may be formed as a single layer across the entire pixels. In this case, preferably, the organic light emitting layer 130 may include an organic light emitting material generating white light. In this case, color filters CF may be formed in each sub-pixel in order to express various colors.

In another example, the organic light emitting layer 130 may be dividedly formed in each sub-pixel. In particular, in this case, the organic light emitting layer 130 may include an organic light emitting material emitting any one of red, green, and blue light in each sub-pixel.

Thereafter, a second electrode 128 formed of a fourth conductive film is formed on the substrate 101 with the organic light emitting layer 130 formed thereon.

The second electrode 128 is formed on the organic light emitting layer 130 and provides electrons to the organic light emitting layer 130.

The second electrode 128 may be formed to cover the entirety of the substrate 101. That is, the first electrode 118 is divided by sub-pixels, but the second electrode 128 may be formed as a single layer across the entire pixels.

A predetermined thin film encapsulating layer is formed on the OLED formed in such a manner to seal the OLED.

A polarization film may be provided on an upper surface of the thin film encapsulating layer in order to reduce reflection of external light of the organic light emitting display device to thus enhance contrast.

Meanwhile, as mentioned above, in the first example embodiment, the bank 115e may also serve as a protective layer. However, the present invention is not limited thereto, and a protective layer may serve as a bank. This will be described through a second example embodiment of the present invention.

Figure 7:
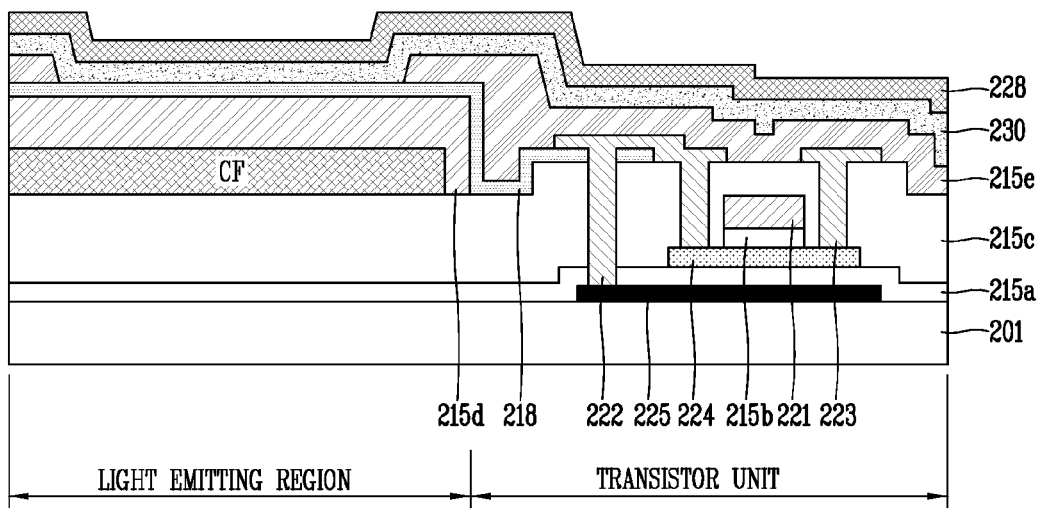
FIG. 7 is a cross-sectional view illustrating a structure of an organic light emitting display device according to a second example embodiment of the present invention.

FIG. 7 is a cross-sectional view illustrating a structure of an organic light emitting display device according to a second example embodiment of the present invention.

The organic light emitting display device illustrated in FIG. 7 includes the same components as those of the first example embodiment described above, except that a protective layer is provided instead of the bank.

That is, referring to FIG. 7, the organic light emitting display device according to the second example embodiment may include a transistor, a white OLED and a color filter formed on a substrate 201.

First, a driving TFT as a transistor includes an active layer 224, a gate electrode 221, a source electrode 223 and a drain electrode 222.

The active layer 224 may be formed of an oxide semiconductor.

However, the present disclosure is not limited thereto and the active layer may be formed of an amorphous silicon film, a polycrystalline silicon film formed by crystallizing amorphous silicon, or an organic semiconductor.

Here, a buffer layer 215a may be formed between the substrate 201 and the active layer 224.

A light blocking layer 225 formed of an opaque material such as molybdenum (Mo) may be formed between the buffer layer 215a below the active layer 224 and the substrate 201.

Gate wirings, namely, a gate line (not shown) including a gate electrode 221 and a first storage electrode (not shown), are formed on the active layer 224 with a gate insulating layer 215b interposed therebetween.

An interlayer insulating layer 215c is formed on the gate electrode 221 and the gate line and the first storage electrode, and a color filter CF is formed thereon.

An overcoat layer 215d is formed on the color filter CF to cover the color filter CF.

The overcoat layer 215d may be formed only in a light emitting region in which the color filter CF is formed. In this case, contamination due to pigment eluted from the color may be prevented.

A first electrode layer 218, a pixel electrode, is formed on the overcoat layer 215d to cover the overcoat layer 215d. Here, the first electrode 218 covers the overcoat layer 215d formed in the light emitting region, and extends from one side thereof to the transistor unit so as to be formed on the interlayer insulating layer 215c.

Data wirings, namely, a data line (not shown), a driving voltage line (not shown), source and drain electrodes 223 and 222, and a second storage electrode (not shown), are formed on the interlayer insulating layer 215c with the first electrode 218 formed thereon.

The source electrode 223 and the drain electrode 222 are formed to be spaced apart from one another by a predetermined distance and electrically connected to the active layer 224. In detail, first and second contact holes exposing the active layer 224 are formed in the interlayer insulating layer 215c, and the source and drain electrodes 223 and 222 are electrically connected to the active layer 224 through the first and second contact holes.

Here, another portion of the drain electrode 222 is formed on the first electrode 218 and connected to the first electrode 218. In this manner, in this embodiment, the first electrode 218 is positioned under the drain electrode 222.

The another portion of the drain electrode 222 may be electrically connected to the light blocking layer 225. In detail, a third contact hole exposing the light blocking layer 225 may be formed in the buffer layer 215a, the interlayer insulating layer 215c, and the first electrode 218, and the drain electrode 222 may be electrically connected to the light blocking layer 225 through the third contact hole. In this case, an electrical influence of the light blocking layer 225 on the active layer 224 may be minimized.

However, the present disclosure is not limited thereto, and the drain electrode 222 according to embodiments may not be connected to the light blocking layer 225.

Also, the drain electrode 222 may be connected to a side surface of the first electrode 218 where the third contact hole is formed, as well as to an upper surface of the first electrode 218.

In this manner, the source electrode 223 according to the second example embodiment may be provided within the first contact hole and on the interlayer insulating layer 215c, and portions of the drain electrode 222 are provided within the second and third contact holes and on the interlayer insulating layer 215c and the other portion of the drain electrode 222 may be provided on the first electrode 218. Thus, contact resistance may be reduced.

Here, the second storage electrode may overlap a portion of the first storage electrode therebelow with the interlayer insulating layer 215c interposed therebetween to form a storage capacitor.

A protective layer 215e is formed on the substrate 201 with the data line, the driving voltage line, the source and drain electrodes 223 and 222, and the second storage electrode formed thereon.

In this manner, in the second example embodiment, the protective layer 215e may also serve as a bank. Thus, the number of masks may be reduced.

That is, the protective layer 215e according to the second embodiment surrounds the vicinity of edges of the first electrode 218, like a bank, to define an opening, and is formed of an inorganic insulating material. The protective layer 215e may be formed directly on the source and drain electrodes 223 and 222 so as to be in contact with the source and drain electrodes 223 and 222.

Three sub-pixels are separated by the protective layer 215e.

An organic light emitting layer 230 and a second electrode 228, a common electrode, are sequentially formed on the substrate 201 with the protective layer 215e formed thereon.

The OLED may include the first electrode 218, the organic light emitting layer 230, and the second electrode 228.

Meanwhile, the present disclosure may also be applied to a structure in which an overcoat layer is not formed on the color filter, and this will be described in detail through third and fourth example embodiments of the present disclosure.

Figure 8:
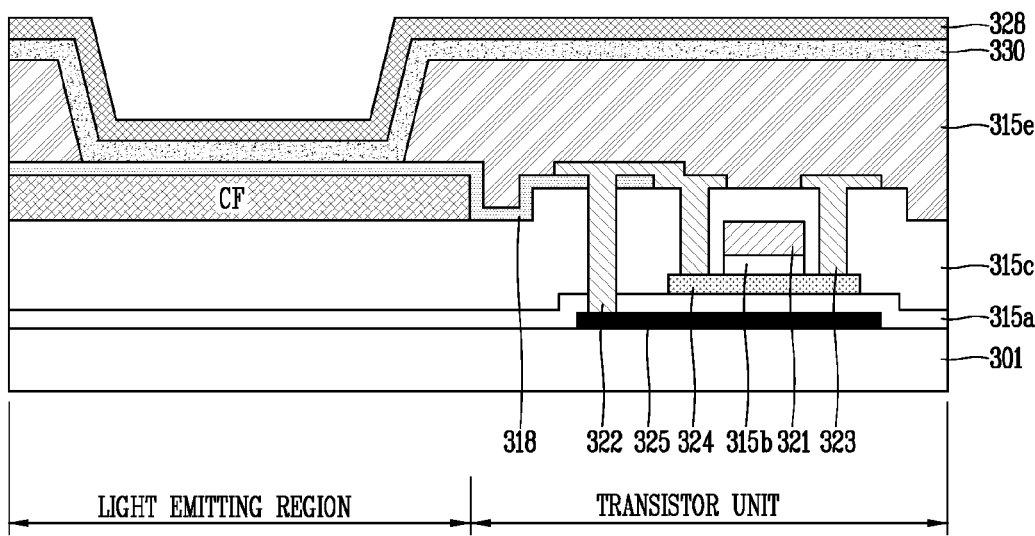
FIG. 8 is a cross-sectional view illustrating a structure of an organic light emitting display device according to a third example embodiment of the present invention.

FIG. 8 is a cross-sectional view illustrating a structure of an organic light emitting display device according to a third example embodiment of the present invention.

The organic light emitting display device illustrated in FIG. 8 is a bottom emission type organic light emitting display device, for example. However, the present invention is not limited thereto and may also be applied to a top emission type organic light emitting display device or to a dual-emission type organic light emitting display device as well.

Also, the present invention is not limited to the illustrated TFT having a coplanar structure.

The organic light emitting display device illustrated in FIG. 8 includes, for example, a white OLED, and in this case, since the organic light emitting layer emits white light, color filters for changing white light into red, green, and blue light are used.

Referring to FIG. 8, a single sub-pixel may include a transistor, a white OLED and a color filter CF formed on a substrate 301.

First, a driving TFT as a transistor includes an active layer 324, a gate electrode 321, a source electrode 323 and a drain electrode 322.

The active layer 324 is formed of an insulating material such as transparent plastic or a polymer film on the substrate 301.

The active layer 324 may be formed of an oxide semiconductor.

However, the present disclosure is not limited thereto and the active layer may be formed of an amorphous silicon film, a polycrystalline silicon film formed by crystallizing amorphous silicon, or an organic semiconductor.

Here, a buffer layer 315a may be formed between the substrate 301 and the active layer 324.

A light blocking layer 325 formed of an opaque material such as molybdenum (Mo) may be formed between the buffer layer 315a below the active layer 324 and the substrate 301.

Gate wirings, namely, a gate line (not shown) including a gate electrode 321 and a first storage electrode (not shown), are formed on the active layer 324 with a gate insulating layer 315b interposed therebetween.

An interlayer insulating layer 315c is formed on the gate electrode 321 and the gate line and the first storage electrode, and a color filter CF is formed thereon. The color filter CF is a color conversion material formed in a light emitting region and converting white light output from the OLED into red, green, and blue light.

A first electrode layer 318, a pixel electrode, is formed on the color filter CF to cover the color filter CF. Here, the first electrode 318 covers the color filter CF formed in the light emitting region and extends from one side thereof to the transistor unit so as to be formed on the interlayer insulating layer 315c.

In this manner, in the third example embodiment, the first electrode 318 is positioned directly on the color filter CF.

Data wirings, namely, a data line (not shown), a driving voltage line (not shown), source and drain electrodes 323 and 322, and a second storage electrode (not shown), are formed on the interlayer insulating layer 315c with the first electrode 318 formed thereon.

The source electrode 323 and the drain electrode 322 are formed to be spaced apart from one another by a predetermined distance and electrically connected to the active layer 324. In detail, first and second contact holes exposing the active layer 324 are formed in the interlayer insulating layer 315c, and the source and drain electrodes 323 and 322 are electrically connected to the active layer 324 through the first and second contact holes.

Here, another portion of the drain electrode 322 is formed on the first electrode 318 and connected to the first electrode 318. In this manner, in this embodiment of the present disclosure, the first electrode 318 is positioned under the drain electrode 322, eliminating the necessity of a protective layer for insulating the data wiring and the first electrode 318. Thus, the number of masks may be reduced.

The other portion of the drain electrode 322 may be electrically connected to the light blocking layer 325. In detail, a third contact hole exposing the light blocking layer 325 may be formed in the buffer layer 315a, the interlayer insulating layer 315c, and the first electrode 318, and the drain electrode 322 may be electrically connected to the light blocking layer 325 through the third contact hole. In this case, an electrical influence of the light blocking layer 325 on the active layer 324 may be minimized.

However, the present invention is not limited thereto, and the drain electrode 322 according to embodiments may not be connected to the light blocking layer 325.

Also, the drain electrode 322 may be connected to a side surface of the first electrode 318 where the third contact hole is formed, as well as to an upper surface of the first electrode 318.

In this manner, the source electrode 323 according to the third example embodiment may be provided within the first contact hole and on the interlayer insulating layer 315c, and portions of the drain electrode 322 may be provided within the second and third contact holes and on the interlayer insulating layer 315c, and the other portion of the drain electrode 322 may be provided on the first electrode 318. Thus, contact resistance may be reduced.

Here, the second storage electrode may overlap a portion of the first storage electrode therebelow with the interlayer insulating layer 315c interposed therebetween to form a storage capacitor.

A bank 315e is formed on the substrate 301 with the data line, the driving voltage line, the source and drain electrodes 323 and 322, and the second storage electrode formed thereon.

Like that of the first example embodiment, in the third example embodiment, the bank 315e also serves as a protective layer. However, the present disclosure is not limited thereto and a protective layer may serve as a bank.

Here, the bank 315e surrounds the vicinity of edges of the first electrode 318 to define an opening, and is formed of an organic insulating material. The bank 315e may be formed directly on the source and drain electrodes 323 and 322 so as to be in contact with the source and drain electrodes 323 and 322.

When the bank 315e is formed of an organic insulating material, the bank 315e may serve as a planarization layer flattening an upper surface, as well as serving as a protective layer.

An organic light emitting layer 330 and a second electrode 328, a common electrode, are sequentially formed on the substrate 301 with the bank 315e formed thereon.

The OLED may include the first electrode 318, the organic light emitting layer 330, and the second electrode 328.

The first electrode 318, supplying a current (or a voltage) to the organic light emitting layer 330, defines a light emitting region having a predetermined area.

The organic light emitting layer 330 is formed between the first electrode 318 and the second electrode 328. The organic light emitting layer 330 emits light according to combination of holes supplied from the first electrode 318 and electrons supplied from the second electrode 328.

The organic light emitting layer 330 may have a multi-layer structure including a light emitting layer emitting layer and an auxiliary layer for enhancing luminous efficiency of the light emitting layer.

The organic light emitting layer 330 may be formed as a single layer across the entire pixels. Here, preferably, the organic light emitting layer 330 includes an organic light emitting material generating white light. In this case, a color filter CF may be formed in each sub-pixel in order to express various colors.

In another example, the organic light emitting layer 330 may be dividedly formed in each sub-pixel. In particular, in this case, the organic light emitting layer 330 may include an organic light emitting material emitting any one of red, green, and blue light in each sub-pixel.

The second electrode 328 is formed on the organic light emitting layer 330 and provides electrons to the organic light emitting layer 330.

The second electrode 328 may be formed to cover the entirety of the substrate 301. That is, the first electrode 318 is divided by sub-pixels, but the second electrode 328 may be formed as a single layer across the entire pixels.

Hereinafter, a method of manufacturing the organic light emitting display device according to the third example embodiment as described above will be described in detail with reference to the accompanying drawings.

FIGS. 9A through 9I are cross-sectional views sequentially illustrating a method of manufacturing an organic light emitting display device according to the third example embodiment of the present invention illustrated in FIG. 8.

Figure 9A:
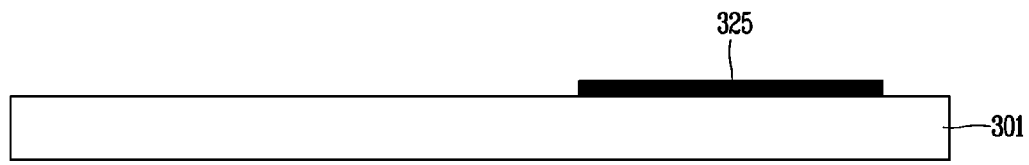
FIGS. 9A through 9I are cross-sectional views sequentially illustrating a method of manufacturing an organic light emitting display device according to the third example embodiment of the present invention illustrated in FIG. 8.

As illustrated in FIG. 9A, a light blocking layer 325 is formed on a substrate 301 formed of a transparent insulating material through a photolithography process (a first mask process).

The light blocking layer 325 may be formed to be limited to a transistor unit.

Figure 9B:
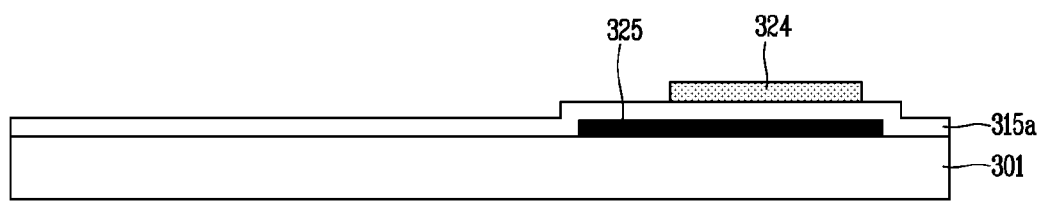

Thereafter, as illustrated in FIG. 9B, a buffer layer 315a is formed on the substrate 301 with the light blocking layer 325 formed thereon.

Thereafter, a semiconductor thin film is formed on the substrate 301 with the buffer layer 315a formed thereon.

Thereafter, the semiconductor thin film is selectively removed through a photolithography process (a second mask process) to form an active layer 324 formed of the semiconductor thin film.

Figure 9C:
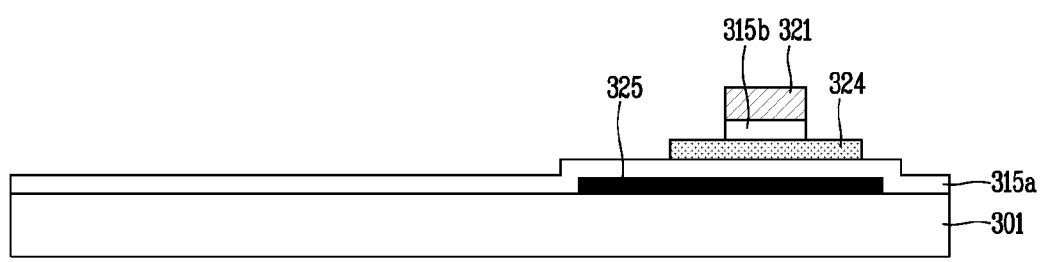

Thereafter, as illustrated in FIG. 9C, an insulating film and a first conductive film are formed on the substrate 301 with the active layer 324 formed thereon.

Thereafter, the insulating film and the first conductive film are selectively removed through a photolithography process (a third mask process) to form a gate line including a gate electrode 321 and a first storage electrode formed of the first conductive film with the gate insulating layer 315b interposed therebetween.

However, the present disclosure is not limited thereto, and the active layer 324, the gate line including the gate electrode 321, and the first storage electrode may be formed through a single photolithography process.

Figure 9D:
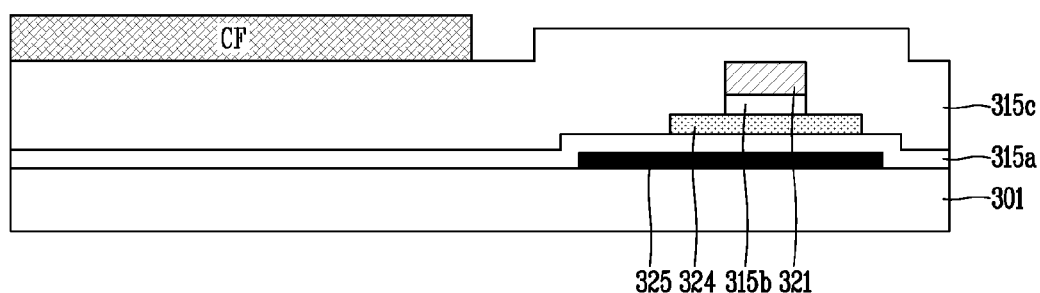

Thereafter, as illustrated in FIG. 9D, an interlayer insulating layer 315c is formed on the entire surface of the substrate 301 with the gate line including the gate electrode 321 and the first storage electrode formed thereon.

Thereafter, a color filter CF is formed on the substrate 301 with the interlayer insulating layer 315c formed thereon by performing a photolithography process three times (fourth to sixth mask processes).

Figure 9E:
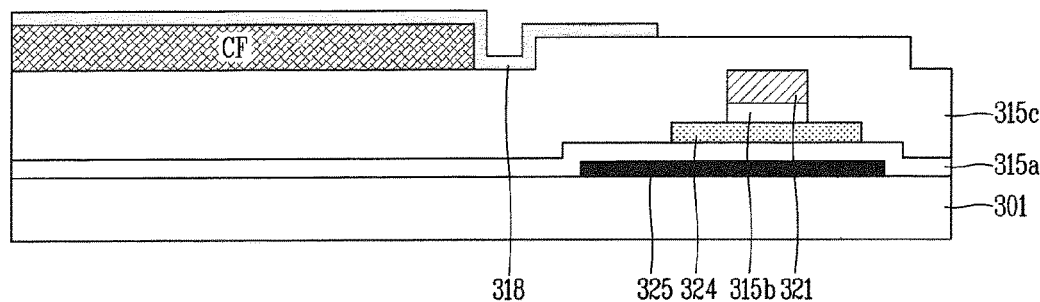

Thereafter, as illustrated in FIG. 9E, a second conductive film is formed on the entire surface of the substrate 301 with the color filter CF formed thereon.

Thereafter, the second conductive film is selectively removed through a photolithography process (a seventh mask process) to form a first electrode 318 formed of the second conductive film.

The first electrode 318 is formed on the color filter CF to cover the color filter CF. That is, the first electrode 318 may cover the color filter CF formed in the light emitting region and extend to the transistor unit from one side thereof so as to be formed on the interlayer insulating layer 315c.

In this manner, in the third example embodiment, since the first electrode 318 is formed directly on the color filter CF, a mask process for forming an overcoat layer may be omitted, and thus, manufacturing process and cost may be further reduced.

Figure 9F:
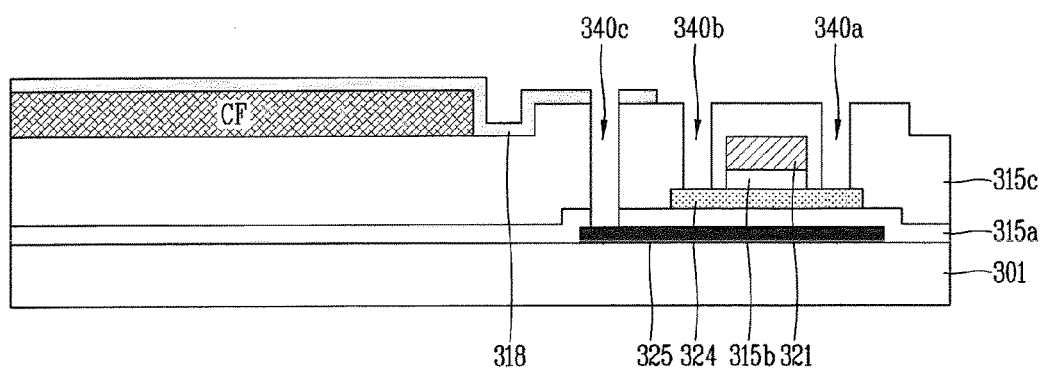

Thereafter, as illustrated in FIG. 9F, portions of the buffer layer 315a, the interlayer insulating layer 315c, and the first electrode 318 are selectively removed through a photolithography process (an eighth mask process) to form first and second contact holes 340a and 340b exposing portions of the active layer 324 and a third contact hole 340c exposing a portion of the light blocking layer 325.

However, the present disclosure is not limited thereto and the third contact hole 340c may not be formed.

Figure 9G:
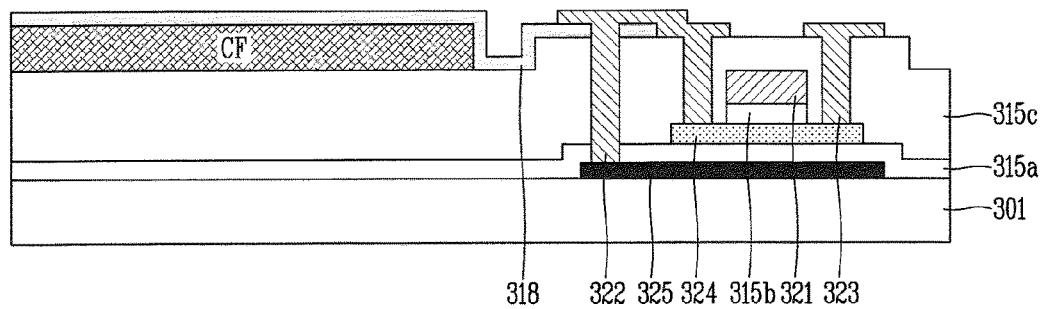

Thereafter, as illustrated in FIG. 9G, a third conductive film is formed on the entire surface of the substrate 301 with the first electrode 318 formed thereon.

Thereafter, the third conductive film is selectively removed through a photolithography process (a ninth mask process) to form a data line (not shown), a driving voltage line (not shown), source and drain electrodes 323 and 322, and a second storage electrode (not shown) on the interlayer insulating layer 315c with the first electrode 318 formed thereon.

The source electrode 323 and the drain electrode 322 are formed to be spaced apart from one another by a predetermined distance and electrically connected to the active layer 324. That is, the source and drain electrodes 323 and 322 are electrically connected to source and drain regions of the active layer 324 through the first and second contact holes.

Here, another portion of the drain electrode 322 is formed on the first electrode 318 so as to be connected to the first electrode 318. As described above, in this embodiment, the first electrode 318 is positioned under the drain electrode 322, and thus, a protective layer for insulating the data wiring and the first electrode 318 is not required.

The other portion of the drain electrode 322 may be electrically connected to the light blocking layer 325. That is, the other portion of the drain electrode 322 may be electrically connected to the light blocking layer 325 through the third contact hole. In this case, an electrical influence of the light blocking layer 325 on the active layer 324 may be minimized.

However, the present invention is not limited thereto, and the drain electrode 322 according to embodiments may not be connected to the light blocking layer 325.

Also, the drain electrode 322 may be connected to a side surface of the first electrode 318 where the third contact hole is formed, as well as to an upper surface of the first electrode 318. Thus, contact resistance may be reduced.

The second storage electrode may overlap a portion of the first storage electrode therebelow with the interlayer insulating layer 315c interposed therebetween to form a storage capacitor.

Figure 9H:
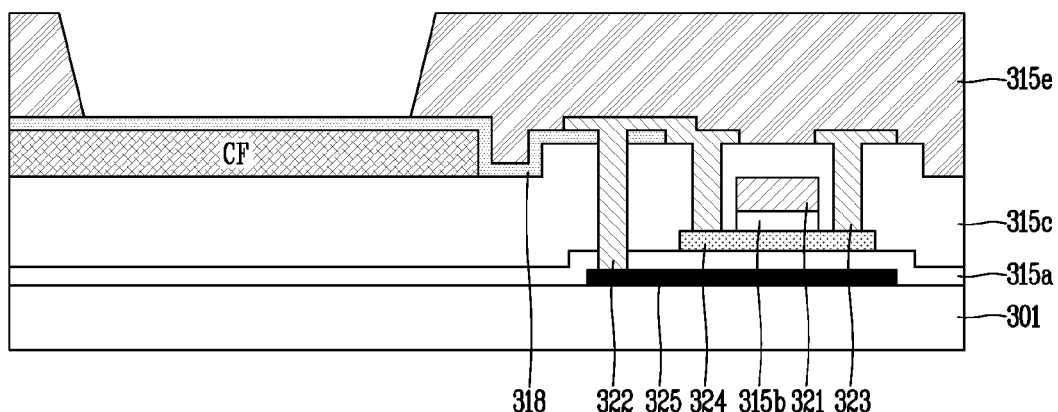

Thereafter, as illustrated in FIG. 9H, a bank 315e is formed on the substrate 301 with the data line, the driving voltage line, the source and drain electrodes 323 and 322, and the second storage electrode formed thereon (a tenth mask process).

Here, the bank 315e surrounds the vicinity of edges of the first electrode 318 to define an opening, and is formed of an organic insulating material.

As described above, to manufacture the organic light emitting display device according to the third example embodiment, a total of ten masks is required to form the light blocking layer, the active layer, the gate wiring, the color filter, the pixel electrode, the contact holes, the data wiring, and the bank. Thus, the number of masks may be reduced, compared with the existing method, further reducing the manufacturing process and cost and enhancing productivity.

Figure 9I:
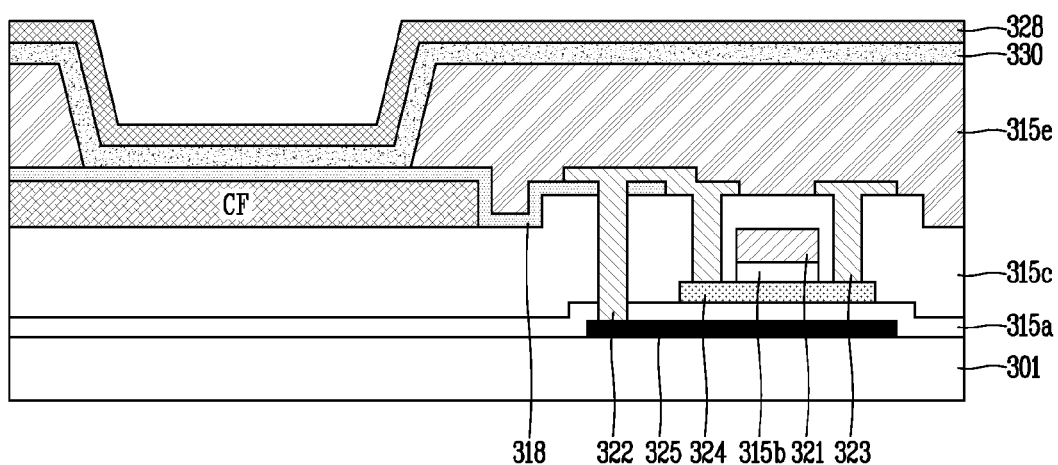

Thereafter, as illustrated in FIG. 9I, an organic light emitting layer 330 is formed on the substrate 301 with the bank 315e formed thereon.

Thereafter, a second electrode 328 formed of a fourth conductive film is formed on the substrate 301 with the organic light emitting layer 330 formed thereon.

The second electrode 328 may be formed to cover the entirety of the substrate 301. That is, the first electrode 318 is divided by sub-pixels, but the second electrode 328 may be formed as a single layer across the entire pixels.

A predetermined thin film encapsulating layer is formed on the OLED formed thusly to seal the OLED.

A polarization film may be provided on an upper surface of the thin film encapsulating layer in order to reduce reflection of external light of the organic light emitting display device to thus enhance contrast.

Meanwhile, as mentioned above, in the third example embodiment, the bank 315e may also serve as a protective layer. However, the preset invention is not limited thereto, and a protective layer may serve as a bank. This will be described through a fourth example embodiment of the present disclosure.

Figure 10:
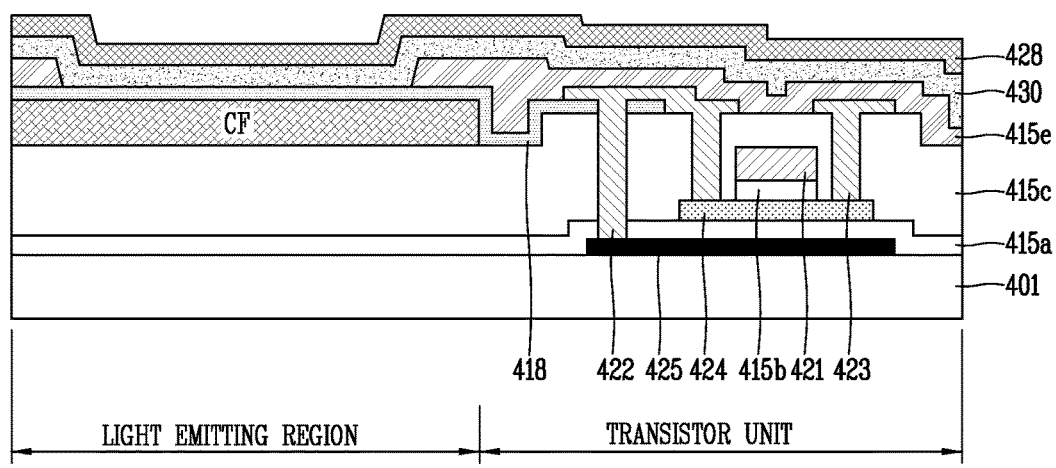
FIG. 10 is a cross-sectional view illustrating a structure of an organic light emitting display device according to a fourth example embodiment of the present invention.

FIG. 10 is a cross-sectional view illustrating a structure of an organic light emitting display device according to a fourth example embodiment of the present invention.

The organic light emitting display device illustrated in FIG. 10 includes the same components as those of the third example embodiment described above, except that a protective layer serves as a bank.

That is, referring to FIG. 10, the organic light emitting display device according to the example fourth embodiment may include a transistor, a white OLED and a color filter formed on a substrate 401.

First, a driving TFT as a transistor includes an active layer 424, a gate electrode 421, a source electrode 423 and a drain electrode 422.

The active layer 424 may be formed of an oxide semiconductor.

However, the present disclosure is not limited thereto and the active layer may be formed of an amorphous silicon film, a polycrystalline silicon film formed by crystallizing amorphous silicon, or an organic semiconductor.

Here, a buffer layer 415a may be formed between the substrate 401 and the active layer 424.

A light blocking layer 425 formed of an opaque material such as molybdenum (Mo) may be formed between the buffer layer 415a below the active layer 424 and the substrate 401.

Gate wirings, namely, a gate line (not shown) including a gate electrode 421 and a first storage electrode (not shown), are formed on the active layer 424 with a gate insulating layer 415b interposed therebetween.

An interlayer insulating layer 415c is formed on the gate electrode 421 and the gate line and the first storage electrode, and a color filter CF is formed thereon.

A first electrode layer 418, a pixel electrode, is formed on the color filter CF to cover the color filter CF. Here, the first electrode 418 covers the color filter CF formed in the light emitting region, and extends from one side thereof to the transistor unit so as to be formed on the interlayer insulating layer 415c.

Data wirings, namely, a data line (not shown), a driving voltage line (not shown), source and drain electrodes 423 and 422, and a second storage electrode (not shown), are formed on the interlayer insulating layer 415c with the first electrode 418 formed thereon.

The source electrode 423 and the drain electrode 422 are formed to be spaced apart from one another by a predetermined distance and electrically connected to the active layer 424. In detail, first and second contact holes exposing the active layer 424 are formed in the interlayer insulating layer 415c, and the source and drain electrodes 423 and 422 are electrically connected to the active layer 424 through the first and second contact holes.

Here, another portion of the drain electrode 422 is formed on the first electrode 418 and connected to the first electrode 418. In this manner, in this embodiment, the first electrode 418 is positioned under the drain electrode 422.

The other portion of the drain electrode 422 may be electrically connected to the light blocking layer 425. In detail, a third contact hole exposing the light blocking layer 425 may be formed in the buffer layer 415a, the interlayer insulating layer 415c, and the first electrode 418, and the drain electrode 422 may be electrically connected to the light blocking layer 425 through the third contact hole. In this case, an electrical influence of the light blocking layer 425 on the active layer 424 may be minimized.

However, the present invention is not limited thereto, and the drain electrode 422 according to embodiments may not be connected to the light blocking layer 425.

Also, the drain electrode 422 may be connected to a side surface of the first electrode 418 where the third contact hole is formed, as well as to an upper surface of the first electrode 418.

In this manner, the source electrode 423 according to the fourth example embodiment may be provided within the first contact hole and on the interlayer insulating layer 415c, and portions of the drain electrode 422 are provided within the second and third contact holes and on the interlayer insulating layer 415 and the other portion of the drain electrode 422 may be provided on the first electrode 418. Thus, contact resistance may be reduced.

Here, the second storage electrode may overlap a portion of the first storage electrode therebelow with the interlayer insulating layer 415c interposed therebetween to form a storage capacitor.

A protective layer 415e is formed on the substrate 401 with the data line, the driving voltage line, the source and drain electrodes 423 and 422, and the second storage electrode formed thereon.

In this manner, in the fourth example embodiment, the protective layer 415e may also serve as a bank, like that of the second example embodiment. Thus, the number of masks may be reduced.

That is, the protective layer 415e according to the fourth example embodiment surrounds the vicinity of edges of the first electrode 418 to define an opening, and is formed of an inorganic insulating material. The protective layer 415e may be formed directly on the source and drain electrodes 423 and 422 so as to be in contact with the source and drain electrodes 423 and 422.

Three sub-pixels are separated by the protective layer 415e.

An organic light emitting layer 430 and a second electrode 428, a common electrode, are sequentially formed on the substrate 401 with the protective layer 415e formed thereon.

The OLED may include the first electrode 418, the organic light emitting layer 430, and the second electrode 428.

What is claimed is:

1. An organic light emitting display device, comprising:
a transistor on a substrate and including an active layer, a gate electrode, a source electrode, and a drain electrode;
a light blocking layer disposed over the substrate and below the active layer of the transistor;
an interlayer insulating layer between the gate electrode and the source and drain electrodes;
a color filter on the interlayer insulating layer;
an overcoat layer covering the color filter to prevent contamination eluted from the color filter;
a first electrode on the color filter,
wherein the first electrode at least partially laterally overlaps the color filter and includes an extended portion extending toward the transistor,
wherein the drain electrode includes a first portion electrically connected to the active layer, a second portion electrically connected to both the extended portion of the first electrode and the light blocking layer, and a bridge connecting the first portion and the second portion on the interlayer insulating layer,
wherein an end of the extended portion of the first electrode is located between the bridge and the interlayer insulating layer, and is sealed by the bridge and the interlayer insulating layer, and
wherein the first electrode is on the overcoat layer to cover the overcoat layer and extends to the transistor from one side of the overcoat layer to directly contact a top surface of the interlayer insulating layer;
a barrier layer surrounding the vicinity of edges of the first electrode; and
an organic light emitting layer and a second electrode on the barrier layer.

2. The organic light emitting display device of claim 1, wherein the organic light emitting layer comprises white light emitting material.

3. The organic light emitting display device of claim 1, wherein the active layer comprises oxide-based composite semiconductor material.

4. The organic light emitting display device of claim 1, wherein the second portion of the drain electrode is connected to a side surface of the extended portion of the first electrode and to an upper surface of the extended portion of the first electrode.

5. The organic light emitting display device of claim 1, wherein the barrier layer is made of an organic insulating material.

6. The organic light emitting display device of claim 1, wherein the barrier layer is made of an inorganic insulating material and has a non-planar upper surface.

7. The organic light emitting display device of claim 1, wherein the barrier layer is made of a photosensitizer including black pigment.

8. The organic light emitting display device of claim 1, wherein the extended portion of the first electrode on the interlayer insulating layer is under a top of the second portion of the drain electrode.

9. The organic light emitting display device of claim 8, wherein the light blocking layer is connected to a bottom of the second portion of the drain electrode.

10. The organic light emitting display device of claim 1, wherein:
the interlayer insulating film is formed of an inorganic insulating material including at least one of silicon nitride (SiNx) and silicon oxide ($SiO_2$), or is formed of a dielectric oxide film including at least one of hafnium (Hf) oxide and aluminum oxide.

11. An organic light emitting display device, comprising:
a transistor on a substrate and including an active layer, a gate electrode, a source electrode, and a drain electrode;
a light blocking layer disposed over the substrate and below the active layer of the transistor;
an interlayer insulating layer between the gate electrode and the source and drain electrodes;
a color filter on the interlayer insulating layer;
a first electrode on the color filter,
wherein the first electrode at least partially laterally overlaps the color filter and includes an extended portion extending toward the transistor and directly contacting a top surface of the interlayer insulating layer,
wherein the drain electrode includes a first portion electrically connected to the active layer, a second portion is located beside the first portion and electrically connected to both the extended portion of the first electrode and the light blocking layer, and a bridge connecting the first portion and the second portion on the interlayer insulating layer,
wherein an upper portion of the second portion of the drain electrode penetrates the extended portion of the first electrode and is located above the extended portion of the first electrode, and
wherein an end of the extended portion of the first electrode is located between the bridge and the interlayer insulating layer, and is sealed by the bridge and the interlayer insulating layer;
a barrier layer surrounding the vicinity of edges of the first electrode to define a light emitting region; and
an organic light emitting layer and a second electrode on the barrier layer.

12. The organic light emitting display device of claim 11, wherein:
the interlayer insulating film is formed of an inorganic insulating material including at least one of silicon nitride (SiNx) and silicon oxide ($SiO_2$), or is formed of a dielectric oxide film including at least one of hafnium (Hf) oxide and aluminum oxide.

* * * * *